(12) United States Patent
Caswell

(10) Patent No.: US 11,070,167 B2
(45) Date of Patent: *Jul. 20, 2021

(54) SYSTEMS AND METHODS FOR REWORKING SHINGLED SOLAR CELL MODULES

(71) Applicant: SunPower Corporation, San Jose, CA (US)

(72) Inventor: Nathaniel Alexis Caswell, Sunnyvale, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/791,949

(22) Filed: Feb. 14, 2020

(65) Prior Publication Data

US 2020/0195193 A1    Jun. 18, 2020

Related U.S. Application Data

(63) Continuation of application No. 15/177,093, filed on Jun. 8, 2016, now Pat. No. 10,673,379.

(51) Int. Cl.
*H01L 31/042*    (2014.01)
*H01L 31/044*    (2014.01)
(Continued)

(52) U.S. Cl.
CPC ............ *H02S 40/34* (2014.12); *H01L 31/042* (2013.01); *H01L 31/044* (2014.12); *H02S 20/25* (2014.12);
(Continued)

(58) Field of Classification Search
CPC ..... H01L 31/042; H01L 31/044; H02S 40/36; H02S 40/34; H02S 20/25
See application file for complete search history.

(56) References Cited

U.S. PATENT DOCUMENTS 2,938,938 A    5/1960    Dickson, Jr.
3,116,171 A    12/1963    Nielsen et al.
(Continued)

FOREIGN PATENT DOCUMENTS

DE    4017933 A1    12/1991
DE    4030713 A1    4/1992
(Continued)

OTHER PUBLICATIONS

International Search Report corresponding to PCT/US2016/047624, dated Oct. 27, 2016, 3 pages.
(Continued)

*Primary Examiner* — Golam Mowla
(74) *Attorney, Agent, or Firm* — Schmidt Patent Law, Inc.

(57) ABSTRACT

A high efficiency configuration for a solar cell module comprises solar cells arranged in a shingled manner to form super cells, which may be arranged to efficiently use the area of the solar module, reduce series resistance, and increase module efficiency. Removing a defective solar cell from a super cell may be difficult, however. It may therefore be advantageous to bypass defective solar cells in a super cell rather than remove and replace them. A bypass conductor may be applied to the rear surface of the super cell to bypass one or more defective solar cells in a super cell or in a solar module comprising super cells.

20 Claims, 13 Drawing Sheets

(51) Int. Cl.
*H02S 40/34* (2014.01)
*H02S 20/25* (2014.01)
*H02S 40/36* (2014.01)

(52) U.S. Cl.
CPC .............. *H02S 40/36* (2014.12); *Y02B 10/10* (2013.01); *Y02E 10/50* (2013.01)

(56) References Cited

U.S. PATENT DOCUMENTS

| | | |
|---|---|---|
| 3,340,096 A | 9/1967 | Mann et al. |
| 3,369,939 A | 2/1968 | Myer |
| 3,459,597 A | 8/1969 | Baron |
| 3,769,091 A | 10/1973 | Leinkram et al. |
| 3,811,181 A | 5/1974 | Leinkram et al. |
| 3,837,924 A | 9/1974 | Baron |
| 4,257,821 A | 3/1981 | Kelly et al. |
| 4,577,051 A | 3/1986 | Hartman |
| 4,617,420 A | 10/1986 | Dilts et al. |
| 4,617,421 A | 10/1986 | Nath et al. |
| 4,652,693 A | 3/1987 | Bar-On |
| 4,877,460 A | 10/1989 | Flodl |
| 5,590,495 A | 1/1997 | Bressler et al. |
| 5,616,185 A | 4/1997 | Kukula |
| 5,990,415 A | 11/1999 | Green |
| 6,034,322 A | 3/2000 | Pollard |
| 6,180,868 B1 | 1/2001 | Yoshino et al. |
| 6,218,605 B1 | 4/2001 | Dally et al. |
| 6,232,545 B1 | 5/2001 | Samaras et al. |
| 6,262,358 B1 | 7/2001 | Kamimura et al. |
| 6,303,853 B1 | 10/2001 | Fraas et al. |
| 6,313,396 B1 | 11/2001 | Glenn |
| 6,315,575 B1 | 11/2001 | Kajimoto |
| 6,353,175 B1 | 3/2002 | Fraas |
| 6,359,209 B1 | 3/2002 | Glenn |
| 6,414,235 B1 | 7/2002 | Luch |
| 6,441,297 B1 | 8/2002 | Keller et al. |
| 6,476,313 B2 | 11/2002 | Kawano |
| 6,489,553 B1 | 12/2002 | Fraas et al. |
| 6,525,262 B1 | 2/2003 | Makita et al. |
| 6,531,653 B1 * | 3/2003 | Glenn .................. H01L 31/052 136/246 |
| 6,538,193 B1 | 3/2003 | Fraas |
| 6,563,289 B1 | 5/2003 | Cross |
| 6,573,445 B1 | 6/2003 | Burgers |
| 6,610,919 B2 | 8/2003 | Ohkubo |
| 6,653,550 B2 | 11/2003 | Hayashi et al. |
| 6,670,787 B2 | 12/2003 | Tachibana |
| 6,770,544 B2 | 8/2004 | Sawada |
| 6,803,513 B2 | 10/2004 | Beemink et al. |
| 7,238,878 B2 | 7/2007 | Gonsiorawski |
| 7,271,333 B2 | 9/2007 | Fabick et al. |
| 7,388,146 B2 | 6/2008 | Fraas et al. |
| 7,390,961 B2 | 6/2008 | Aschenbrenner et al. |
| 7,507,903 B2 | 3/2009 | Luch |
| 7,534,699 B2 | 5/2009 | Wong et al. |
| 7,635,810 B2 | 12/2009 | Luch |
| 7,772,484 B2 | 8/2010 | Li et al. |
| 7,777,128 B2 | 8/2010 | Montello et al. |
| 7,781,672 B2 | 8/2010 | Gaudiana et al. |
| 7,825,329 B2 | 11/2010 | Basol |
| 7,829,781 B2 | 11/2010 | Montello et al. |
| 7,829,785 B2 | 11/2010 | Basol |
| 7,851,700 B2 | 12/2010 | Luch |
| 7,868,249 B2 | 1/2011 | Luch |
| 7,872,192 B1 | 1/2011 | Fraas et al. |
| 7,989,692 B2 | 8/2011 | Luch |
| 7,989,693 B2 | 8/2011 | Luch |
| 8,110,737 B2 | 2/2012 | Luch |
| 8,138,413 B2 | 3/2012 | Luch et al. |
| 8,207,440 B2 | 6/2012 | Basol |
| 8,222,513 B2 | 6/2012 | Luch |
| 8,304,646 B2 | 11/2012 | Luch |
| 8,319,097 B2 | 11/2012 | Luch |
| 8,334,451 B2 | 12/2012 | Polce et al. |
| 8,378,209 B2 | 2/2013 | Masson et al. |
| 8,574,943 B2 | 11/2013 | Murray et al. |
| 8,586,857 B2 | 11/2013 | Everson et al. |
| 8,586,875 B2 | 11/2013 | Morita et al. |
| 8,729,385 B2 | 5/2014 | Luch |
| 8,766,090 B2 | 7/2014 | Sewell et al. |
| 10,084,104 B2 | 9/2018 | Morad et al. |
| 2001/0054262 A1 | 12/2001 | Nath et al. |
| 2003/0029494 A1 | 2/2003 | Ohkubo |
| 2003/0121228 A1 | 7/2003 | Stoehr et al. |
| 2004/0261836 A1 | 12/2004 | Kataoka et al. |
| 2005/0126619 A1 | 6/2005 | Abe et al. |
| 2005/0133079 A1 | 6/2005 | Boulanger et al. |
| 2005/0217717 A1 | 10/2005 | Faris |
| 2005/0263178 A1 | 12/2005 | Montello et al. |
| 2005/0268959 A1 | 12/2005 | Aschenbrenner et al. |
| 2007/0107766 A1 | 5/2007 | Langley, II et al. |
| 2007/0181175 A1 | 8/2007 | Landis |
| 2007/0283996 A1 | 12/2007 | Hachtmann et al. |
| 2007/0283997 A1 | 12/2007 | Hachtmann et al. |
| 2008/0156365 A1 | 7/2008 | Scholz et al. |
| 2008/0216887 A1 | 9/2008 | Hacke et al. |
| 2009/0000221 A1 | 1/2009 | Jacobs et al. |
| 2009/0014505 A1 | 1/2009 | Croft et al. |
| 2009/0038671 A1 | 2/2009 | Yamaguchi |
| 2009/0114279 A1 | 5/2009 | Zhao et al. |
| 2009/0184746 A1 | 7/2009 | Farenbruch |
| 2009/0229596 A1 | 9/2009 | Shin |
| 2010/0001587 A1 | 1/2010 | Casey et al. |
| 2010/0012172 A1 | 1/2010 | Meakin et al. |
| 2010/0043863 A1 | 2/2010 | Wudu et al. |
| 2010/0071752 A1 | 3/2010 | Vellore et al. |
| 2010/0075151 A1 | 3/2010 | Weingord et al. |
| 2010/0078057 A1 | 4/2010 | Karg et al. |
| 2010/0078064 A1 | 4/2010 | Coakley |
| 2010/0084004 A1 | 4/2010 | Ortabasi |
| 2010/0131108 A1 | 5/2010 | Meyer |
| 2010/0136748 A1 | 6/2010 | Autry |
| 2010/0139734 A1 | 6/2010 | Hadar et al. |
| 2010/0147364 A1 | 6/2010 | Gonzalez et al. |
| 2010/0218799 A1 | 9/2010 | Stefani |
| 2010/0224230 A1 | 9/2010 | Luch et al. |
| 2010/0243024 A1 | 9/2010 | Hashimoto et al. |
| 2010/0308662 A1 | 12/2010 | Schatz et al. |
| 2011/0005572 A1 | 1/2011 | Shimizu |
| 2011/0048501 A1 | 3/2011 | Jaus et al. |
| 2011/0067751 A1 | 3/2011 | Meakin et al. |
| 2011/0079263 A1 | 4/2011 | Avrutsky |
| 2011/0083726 A1 | 4/2011 | Takayanagi et al. |
| 2011/0114158 A1 | 5/2011 | Lenox |
| 2011/0114165 A1 | 5/2011 | Chang |
| 2011/0155209 A1 | 6/2011 | Tober et al. |
| 2011/0168237 A1 | 7/2011 | Takeda et al. |
| 2011/0168238 A1 | 7/2011 | Metin et al. |
| 2011/0192448 A1 | 8/2011 | Croft et al. |
| 2011/0197947 A1 | 8/2011 | Croft |
| 2011/0214714 A1 | 9/2011 | Aberle et al. |
| 2011/0240337 A1 | 10/2011 | Montello et al. |
| 2011/0271999 A1 | 11/2011 | Almogy et al. |
| 2011/0272004 A1 | 11/2011 | Davis et al. |
| 2011/0315184 A1 | 12/2011 | Kabade |
| 2012/0031457 A1 | 2/2012 | Taira et al. |
| 2012/0037206 A1 | 2/2012 | Norman et al. |
| 2012/0048349 A1 | 3/2012 | Metin et al. |
| 2012/0118355 A1 | 5/2012 | Rudolfs |
| 2012/0125391 A1 | 5/2012 | Pinarbasi et al. |
| 2012/0152327 A1 | 6/2012 | Pinarbasi et al. |
| 2012/0152349 A1 | 6/2012 | Cao et al. |
| 2012/0161801 A1 | 6/2012 | Hasegawa |
| 2012/0234388 A1 | 9/2012 | Stancel et al. |
| 2012/0244656 A1 | 9/2012 | Kim et al. |
| 2012/0268087 A1 | 10/2012 | Kemahan |
| 2012/0279548 A1 | 11/2012 | Munch et al. |
| 2012/0312347 A1 | 12/2012 | Buettner |
| 2012/0312354 A1 | 12/2012 | Buettner |
| 2012/0318318 A1 | 12/2012 | Metin et al. |
| 2012/0318319 A1 | 12/2012 | Pinarbasi et al. |
| 2012/0325282 A1 | 12/2012 | Snow et al. |
| 2013/0048046 A1 | 2/2013 | Domsic et al. |
| 2013/0068279 A1 | 3/2013 | Buller et al. |

(56) References Cited

U.S. PATENT DOCUMENTS

| | | | |
|---|---|---|---|
| 2013/0096710 | A1 | 4/2013 | Pinarbasi et al. |
| 2013/0152996 | A1 | 6/2013 | DeGroot et al. |
| 2013/0160823 | A1 | 6/2013 | Khouri et al. |
| 2013/0160824 | A1 | 6/2013 | Khouri et al. |
| 2013/0206203 | A1 | 8/2013 | Lommasson et al. |
| 2013/0206206 | A1 | 8/2013 | Bjomeklett et al. |
| 2013/0206210 | A1 | 8/2013 | Niinobe et al. |
| 2013/0206213 | A1 | 8/2013 | He et al. |
| 2013/0206221 | A1 | 8/2013 | Gannon et al. |
| 2014/0060610 | A1 | 3/2014 | Moslehi et al. |
| 2014/0116495 | A1 | 5/2014 | Kim et al. |
| 2014/0124014 | A1 | 5/2014 | Morad |
| 2014/0318613 | A1 | 10/2014 | Von Campe et al. |
| 2015/0349175 | A1 | 12/2015 | Morad et al. |
| 2015/0349703 | A1 | 12/2015 | Morad |
| 2016/0158890 | A1 | 6/2016 | Gonzalez et al. |
| 2016/0163888 | A1 | 6/2016 | Reddy |
| 2016/0163903 | A1 | 6/2016 | Yang et al. |
| 2016/0163907 | A1 | 6/2016 | Gonzalez et al. |
| 2016/0163908 | A1 | 6/2016 | Gonzalez et al. |
| 2016/0163909 | A1 | 6/2016 | Gonzalez et al. |
| 2016/0163912 | A1 | 6/2016 | Gonzalez et al. |
| 2016/0163913 | A1 | 6/2016 | Gonzalez |
| 2016/0163914 | A1 | 6/2016 | Gonzalez et al. |
| 2017/0054047 | A1 | 2/2017 | Morad et al. |
| 2017/0359019 | A1 | 12/2017 | Caswell |

FOREIGN PATENT DOCUMENTS

| | | | |
|---|---|---|---|
| DE | 102009026027 A1 | 1/2011 | |
| EP | 2284908 A1 | 2/2011 | |
| EP | 2362430 A1 | 8/2011 | |
| EP | 002032581-0005 | 4/2012 | |
| ES | 2146182 A1 | 7/2000 | |
| FR | 910321-001 | 1/1991 | |
| JP | 11-350685 A | 12/1999 | |
| JP | 2014017447 A | 1/2014 | |
| WO | 2009047815 A1 | 4/2009 | |
| WO | 2010095583 A1 | 8/2010 | |
| WO | 2012033657 A2 | 3/2012 | |
| WO | 2012099705 A2 | 7/2012 | |
| WO | 2013020590 A1 | 2/2013 | |
| WO | 2014074826 A2 | 5/2014 | |
| WO | 2014098771 A1 | 6/2014 | |
| WO | 2014192272 A1 | 12/2014 | |
| WO | 2015001413 A1 | 1/2015 | |

OTHER PUBLICATIONS

Written Opinion of the International Searching Authority corresponding to PCT/US2016/047624, dated Oct. 27, 2016, 6 pages.
Goldberg, Lee H., "Active Bypass Diodes Improve Solar Panel Efficiency and Performance", Digi-Key Corporation, http://www.digikey.com/en/articles/techzone/2012/dec/activebypassdiodesimprovesolarpanelefficiencyandperformance, Dec. 12, 2012, 8 pages.
Herrmann, W. et al., "Operational Behaviour of Commercial Solar Cells Under Reverse Biased Conditins", TÜV Rheinland Sicherheit und Umweltschutz GmbH, 3 pages.
Creative Materials, "Product Announcement: Flexible Electrically Conductive Adhesive Family As Solder Replacements in Solar Cells", http://www.creativematerials.com/news/pr-conductive-adhesive-for-solar-cells.php, Feb. 9, 2015, 2 pages.
Creative Materials, "124-08 A/B Electrically Conductive Epoxy Adhesive", www.creativematerials.com, Apr. 22, 2010, Revision: E, 1 page.
Herrmann, W. et al. "Hot Spot Investigations on PV Modules—New Concepts for a Test Standard and Consequences for Module Design with Respect to Bypass Diodes", TÜV Rheinland Sicherheit und Umweltschutz GmbH, 4 pages.
Yang, et al., "Investigation of the Relationship between Reverse Current of Crystalline Silicon Solar Cells and Conduction of Bypass Diode", Hindawi Publishing Corporation International Journal of Photoenergy, vol. 2012, Article ID 357218, 6 pages.
Breitenstein, O. et al., "Shunts due to laser scribing of solar cells evaluated by highly sensitive lock-in thermography", 11th International Photovoltaic Science and Engineering Conference (PVSEC-11), Sep. 20-24, 1999 Sapporo, Japan, 9 pages.
KYOCERA, News Releases 2009, "KYOCERA Explains Innovations Used in Solar Panel for New Toyota Prius", http://global.kyocera.com/new/2009/0902/fpri.html, Dec. 21, 2014, 2 pages.
Herrmann, W. et al., "Hot Spot Investigations on PV Modules—New Concepts for a Test Standard and Consequences for Module Design with Respect to Bypass Diodes," TÜV Rheinland Sicherheit und Umweltschutz GmbH, http://ieeexplore.ieee.org, Dec. 20, 2014, 6 pages.
Mäki, et al., "Power Losses in Long String and Parallel-Connected Short Strings of Series-Connected Silicon-Based Photovoltaic Modules Due to Partial Shading Conditions", IEEE Transactions on Energy Conversion, vol. 27, No. 1, Mar. 2012, pp. 173-183.
Halavani, et al., "Results of Pressue-Only Cell Interconnections in High Voltage PV-Modules", 29th European Photovoltaic Solar Energy Conference and Exhibition, Vienna University of Technology, pp. 64-68.
Heimann, M., et al., "Ultrasonic Bonding of Aluminum Ribbons to Interconnect High-Efficiency Crystalline-Silicon Solar Cells", Energy Procedia 27 (2012) pp. 670-675.
Silvestre S., et al., "Study of bypass diodes configuration on PV modules", Applied Energy 86 (2009) pp. 1632-1640.
Scholten, "Silicone Encapsulation of c-Si Photovoltaic Modules", Solar Novus Today, Feb. 10, 2014, 5 pages, http://www.solarnovus.com.
3M™ "Thermally Conductive Heat Spreading Tape, 9876B-05, 9876B-08, 9876-10, 9876-15", Nov. 2012, pp. 1-4.
STMicroelectronics, "How to choose a bypass diode for a silicon panel junction box", Sep. 2011, pp. 1-24.
Kray, D., et al., "Reducing AG Cost and Increasing Efficiency. Multicrystalline Silicon Solar Cells With Direct Plated Contacts Exceeding 17% Efficiency", 26th EU PVSEC Proceedings, pp. 1199-1202.
Matula, J. Phys. Chem. Ref. Daa, vol. 8, No. 4, 1979.
U.S. Appl. No. 62/088,509 "System, Method, and Apparatus for Automatic Manufacturing of Solar Panels" filed Dec. 5, 2014, Jiunn Benjamin Heng, et al., 28 pages.
U.S. Appl. No. 62/143,694 "Systems and Methods for Precision Automation of Manufacturing Solar Panels" filed Apr. 6, 2015, Jiunn Benjamin Heng, et al., 101 pages.
R.A. Matula, "Electrical Resistivity of Copper, Bold, Palladium, and Silver" J. Phys. Chem. Ref. Data, vol. 8, No. 4, 1979, 152 pages.
EPO-TEK H20 Technical Data Sheet.
Office Action corresponding to German application No. 112016003768.6, dated Jul. 22, 2019, Applicant: SunPower Corporation, 4 pages.

* cited by examiner

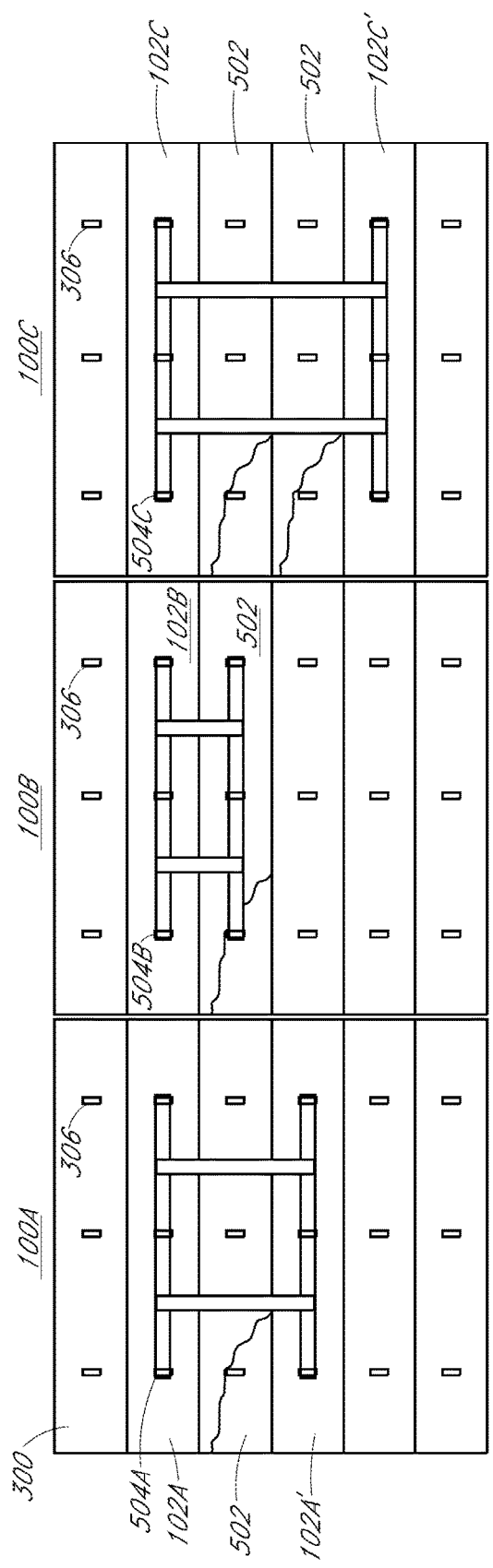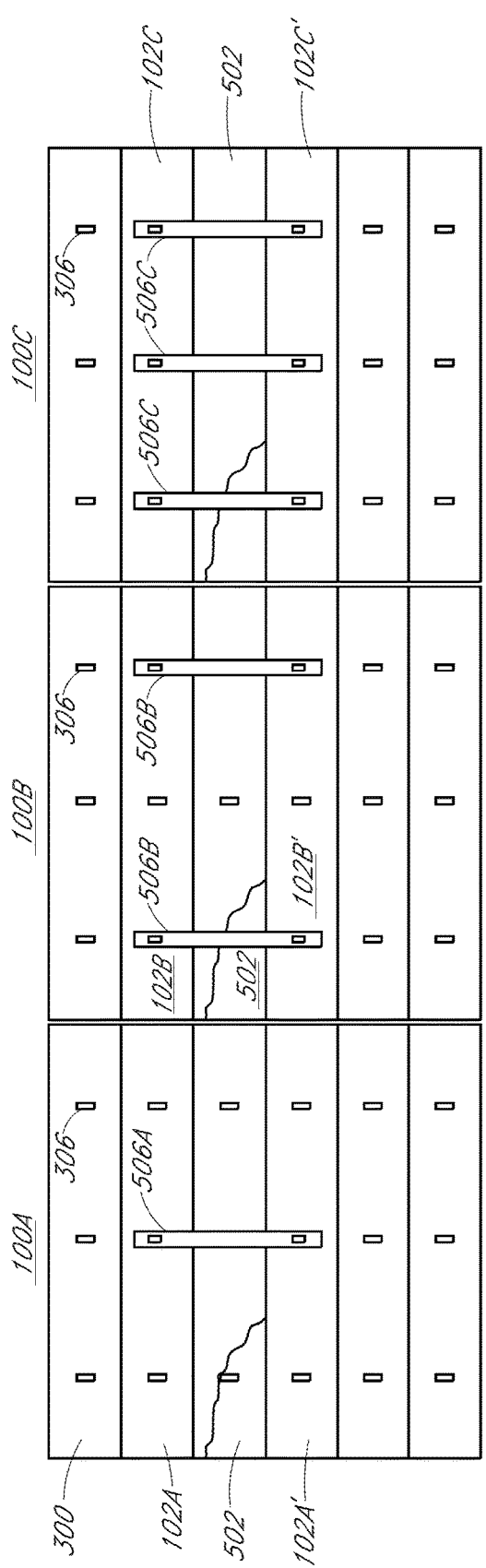
FIG. 5A
FIG. 5B

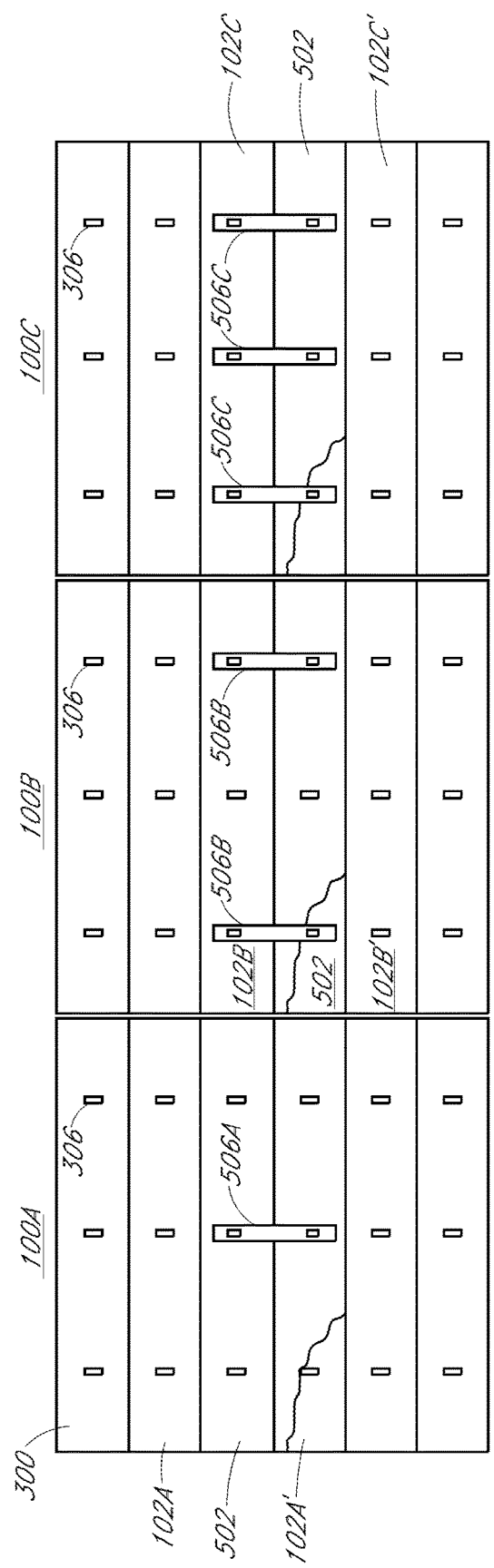
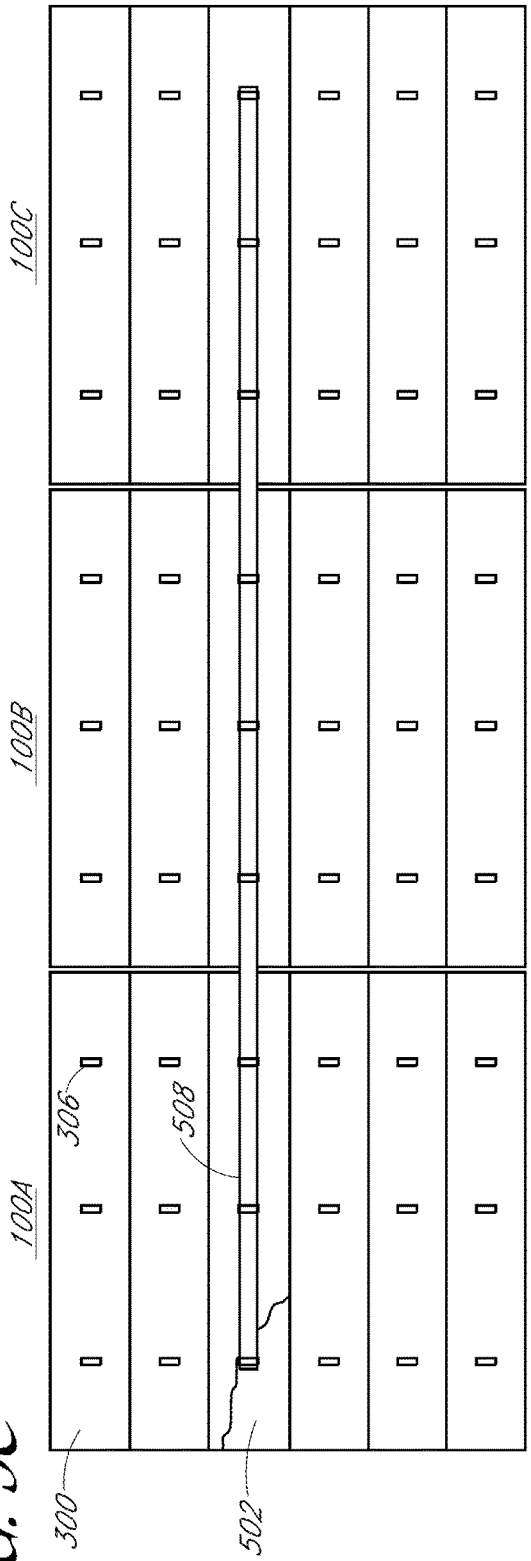
FIG. 5C
FIG. 5D

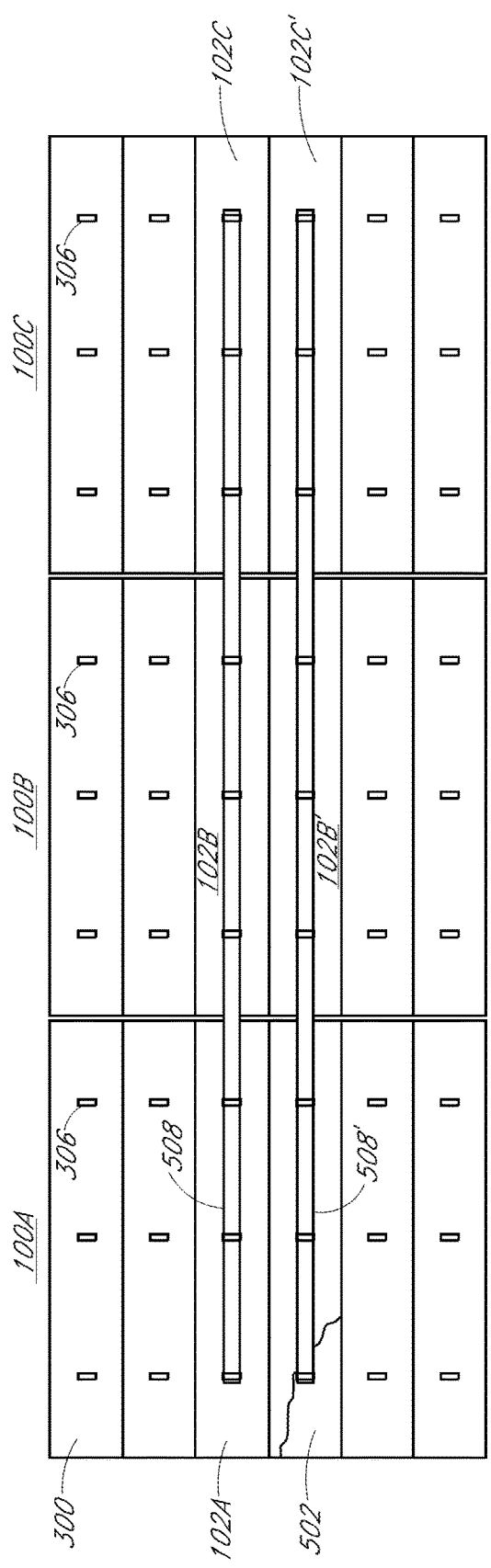
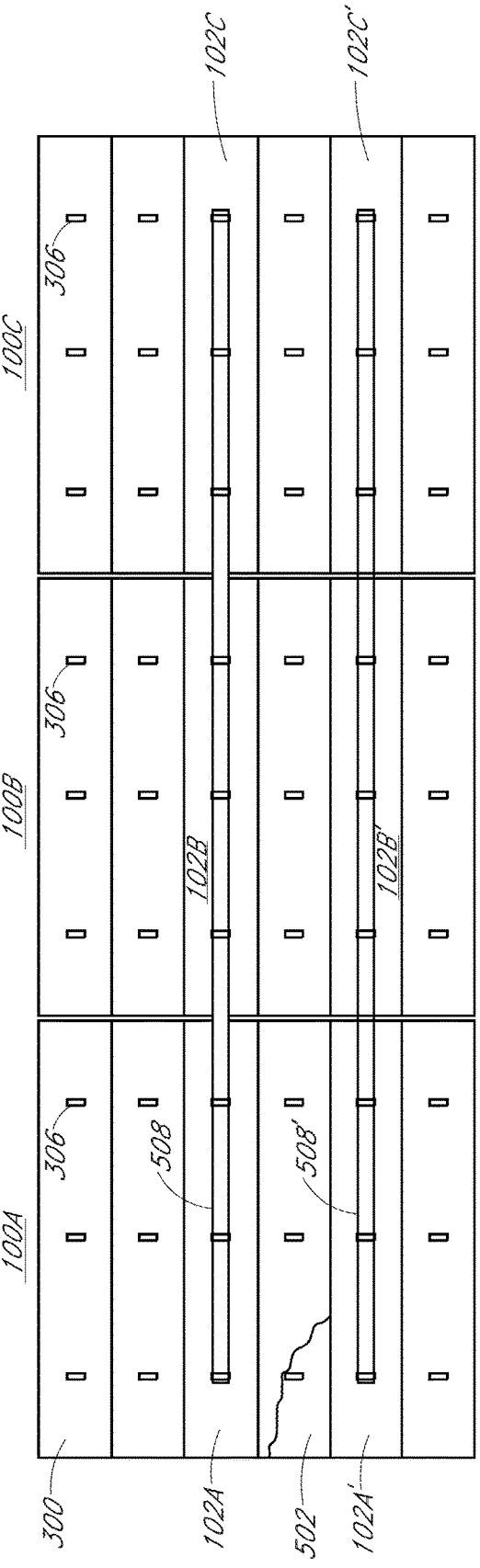
FIG. 5E
FIG. 5F

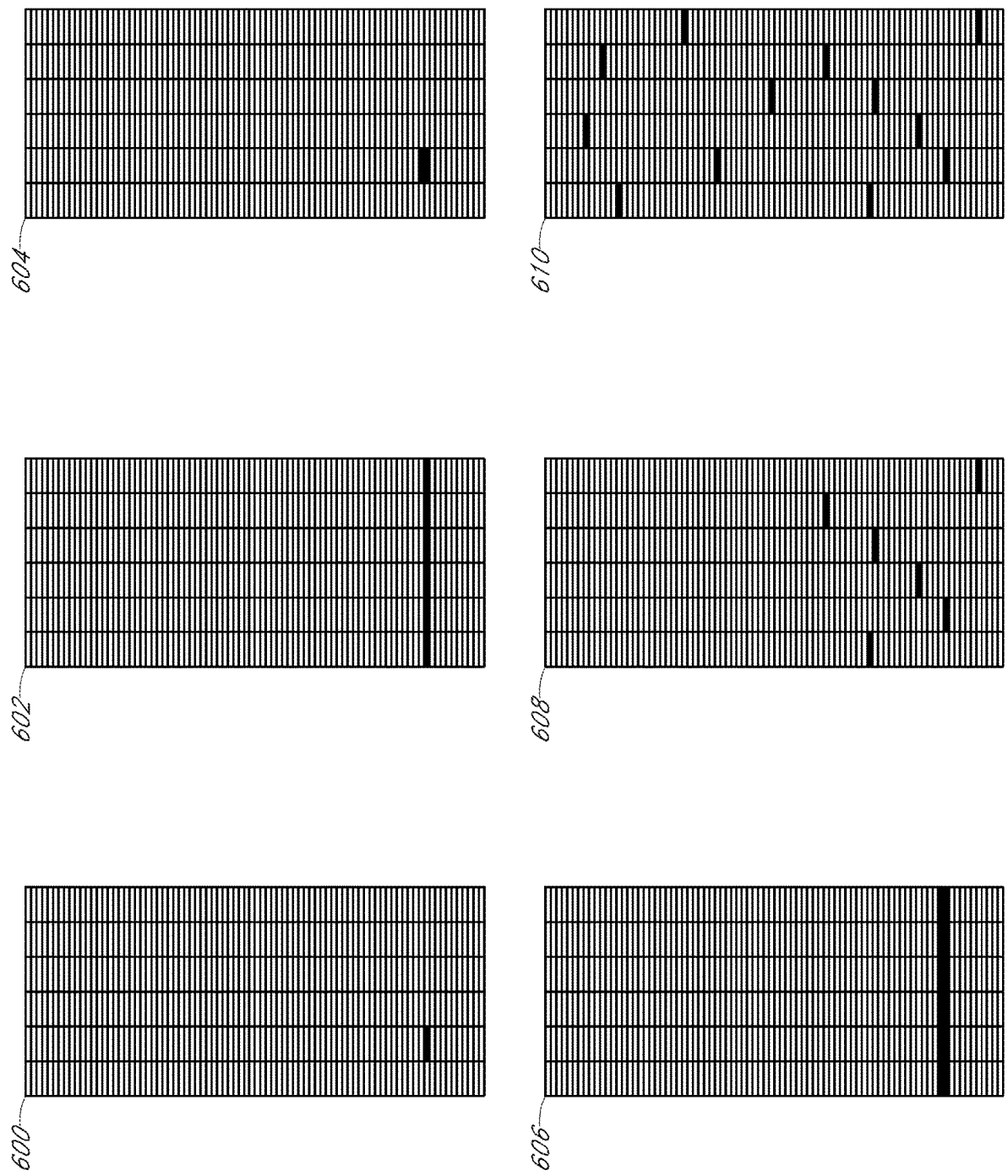

SYSTEMS AND METHODS FOR REWORKING SHINGLED SOLAR CELL MODULES

CROSS REFERENCE TO RELATED APPLICATIONS

The present application is a continuation application of U.S. patent application Ser. No. 15/177,093 titled "SYSTEMS AND METHODS FOR REWORKING SHINGLED SOLAR CELL MODULES" filed Jun. 8, 2016. Each of the patent applications listed above is incorporated herein by reference in its entirety.

STATEMENT REGARDING FEDERALLY SPONSORED RESEARCH OR DEVELOPMENT

This invention was made with government support under DE-EE0007190 awarded by The U.S. Department of Energy. The government has certain rights in the invention.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to conductive regions on the solar cell to direct an electrical current from the cell to an external circuit. When PV cells are combined in an array such as a PV module, the electrical energy collected from all of the PV cells can be combined in series and parallel arrangements to provide power with a desired voltage and current.

BRIEF DESCRIPTION OF THE DRAWINGS

The figures described below depict various aspects of the system and methods disclosed herein. It should be understood that each figure depicts an embodiment of a particular aspect of the disclosed system and methods, and that each of the figures is intended to accord with a possible embodiment thereof. Further, wherever possible, the following description refers to the reference numerals included in the following figures, in which features depicted in multiple figures are designated with consistent reference numerals.

FIGS. 5A, 5B, 5C, 5D, 5E, 5F, 5G, 5H, and 5I show example illustrations of defective cell bypass conductors partially or completely bypassing defective solar cells in a super cell;

FIG. 6 shows examples of solar modules with one or more completely bypassed solar cells and/or defective solar cells;

SUMMARY

Figure 1:
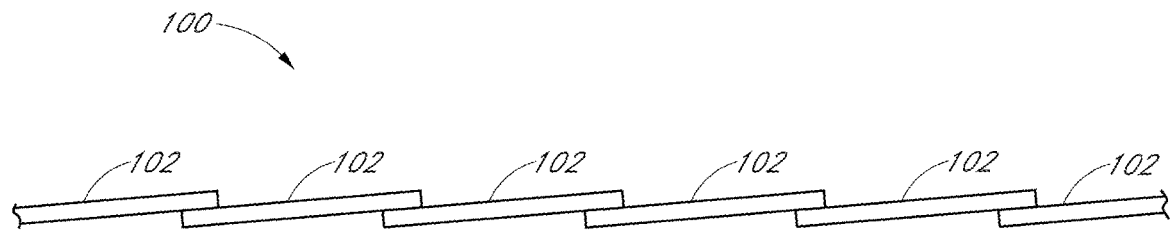
FIG. 1 shows a cross-sectional view of a string of series-connected solar cells arranged in a shingled manner with the ends of adjacent solar cells overlapping and electrically connected to form a super cell.

Embodiments may include a photovoltaic module comprising: a first super cell comprising a plurality of solar cells, each having a rear surface, arranged with sides of adjacent solar cells overlapping in a shingled manner and conductively bonded to each other in series wherein at least one of the plurality of solar cells is a first defective solar cell; and a bypass conductor coupled to the rear surface of a first solar cell in the first super cell and coupled to the rear surface of a second solar cell in the first super cell disposed after the first defective solar cell in series, wherein the bypass conductor is adapted to bypass the first defective solar cell by conducting electricity from the rear surface of the first solar cell in the first super cell to the rear surface of the second solar cell in the first super cell.

Embodiments may also include an apparatus comprising: a plurality of solar cells, including a first solar cell and a second solar cell, arranged with sides of adjacent solar cells overlapping in a shingled manner and conductively bonded to each other in series wherein at least one of the plurality of solar cells is a defective solar cell, wherein each solar cell has a rear surface having at least one set of contact pads (e.g., a plurality of sets of contact pads); a bypass conductor coupled to at least one set of contact pads of the first solar cell and at least one set of contact pads of the second solar cell, wherein the bypass conductor bypasses the defective solar cell.

Embodiments may further include, an apparatus comprising: a plurality of solar cells, including a first solar cell and a second solar cell, arranged with sides of adjacent solar cells overlapping in a shingled manner and conductively bonded to each other in series wherein one of more of the plurality of solar cells is one or more defective solar cells, wherein each solar cell has a rear surface; and a bypass conductor coupled to the rear surface of the first solar cell and coupled to the rear surface of the second solar cell; wherein the bypass conductor is adapted to short circuit the one or more defective solar cells by conducting electricity from the rear surface of the first solar cell to the rear surface of the second solar cell.

DETAILED DESCRIPTION

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" silicon solar cell does not necessarily imply that this silicon solar cell is the first silicon solar cell in a sequence; instead the term "first" is used to differentiate this silicon solar cell from another silicon solar cell (e.g., a "second" silicon solar cell).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

FIG. 1 shows a cross-sectional view of a string of series-connected solar cells 102 arranged in a shingled manner with the ends of adjacent solar cells overlapping and electrically connected to form a super cell 100. Each solar cell 102 comprises a semiconductor diode structure and electrical contacts to the semiconductor diode structure by which electric current generated in solar cell 102 when it is illuminated by light may be provided to an external load.

In the examples described in this specification, each solar cell 102 is a crystalline silicon solar cell having front (sun side) surface and rear (shaded side) surface metallization patterns providing electrical contact to opposite sides of an n-p junction, the front surface metallization pattern is disposed on a semiconductor layer of n-type conductivity, and the rear surface metallization pattern is disposed on a semiconductor layer of p-type conductivity. However, any other suitable solar cells employing any other suitable material system, diode structure, physical dimensions, or electrical contact arrangement may be used instead of or in addition to solar cells 102 in the solar modules described in this specification. For example, the front (sun side) surface metallization pattern may be disposed on a semiconductor layer of p-type conductivity, and the rear (shaded side) surface metallization pattern disposed on a semiconductor layer of n-type conductivity.

Referring again to FIG. 1, in super cell 100 adjacent solar cells 102 are conductively bonded to each other in the region in which they overlap by an electrically conducting bonding material that electrically connects the front surface metallization pattern of one solar cell to the rear surface metallization pattern of the adjacent solar cell. Suitable electrically conducting bonding materials may include, for example, electrically conducting adhesives and electrically conducting adhesive films and adhesive tapes, and conventional solders. Preferably, the electrically conducting bonding material provides mechanical compliance in the bond between the adjacent solar cells that accommodates stress arising from mismatch between the coefficient of thermal expansion (CTE) of the electrically conducting bonding material and that of the solar cells (e.g., the CTE of silicon). To provide such mechanical compliance, in some variations the electrically conducting bonding material is selected to have a glass transition temperature of less than or equal to about 0° C. To further reduce and accommodate stress parallel to the overlapping edges of the solar cells arising from CTE mismatch, the electrically conductive bonding material may optionally be applied only at discrete locations along the overlapping regions of the solar cells rather than in a continuous line extending substantially the length of the edges of the solar cells.

The thickness of the electrically conductive bond between adjacent overlapping solar cells formed by the electrically conductive bonding material, measured perpendicularly to the front and rear surfaces of the solar cells, may be for example less than about 0.1 mm. Such a thin bond reduces resistive loss at the interconnection between cells, and also promotes flow of heat along the super cell from any hot spot in the super cell that might develop during operation. The thermal conductivity of the bond between solar cells may be, for example, ≥about 1.5 Watts/(meter K).

Additionally, because the profitability of production of solar modules 400 comprising super cells 100 may depend on high volume of production with low margins, it may be important to repair or rework super cells 100 where one or more solar cells 102 is defective as discussed herein. However because of the delicacy of the super cell 100 (e.g., the thinness of the solar cells 102, the relative strength of the electrically conductive bond, etc.), removing a solar cell 102 from a super cell 100 may be difficult and expensive. Additionally, inserting a replacement solar cell 102 may also be difficult and expensive. Accordingly, it may be advantageous to bypass solar cells 102 to avoid or mitigate defects as discussed herein rather than removing the solar cells 102.

Figure 2:
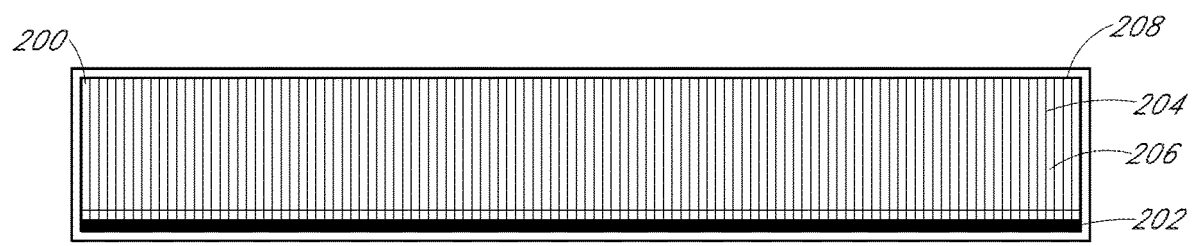
FIG. 2 shows the front surface metallization pattern of an example rectangular solar cell that may be used in a super cell.

FIG. 2 shows the front surface metallization pattern 200 of an example rectangular solar cell 102 that may be used in a super cell 100. Other shapes for solar cell 102 may also be used, as suitable (e.g., a square solar cell 102, a solar cell 102 with one or more chamfered corners). In the illustrated example the front surface metallization pattern 200 of solar cell 102 includes a bus bar 202 positioned adjacent to the edge of one of the long sides of solar cell 102 and running parallel to the long sides for substantially the length of the long sides, and fingers 204 attached perpendicularly to the bus bar and running parallel to each other and to the short sides of solar cell 102 for substantially the length of the short sides. The example front surface metallization pattern 200 of FIG. 2 also includes an optional end conductor 208 that interconnects fingers 204 at their far ends, opposite from bus bar 202. The width of end conductor 208 may be about the same as that of a finger 204, for example. End conductor 208 interconnects fingers 204 to electrically bypass cracks that may form between bypass conductor 206 and end conductor 208, and thereby provides a current path to bus bar 202 for regions of solar cell 102 that might otherwise be electrically isolated by such cracks.

In the example of FIG. 2 solar cell 102 has a length of about 156 mm, a width of about 26 mm, and thus an aspect ratio (length of short side/length of long side) of about 1:6. Six such solar cells may be prepared on a standard 156 mm×156 mm dimension silicon wafer, then separated (diced) to provide solar cells as illustrated. In other variations, eight solar cells 102 having dimensions of about 19.5 mm×156 mm, and thus an aspect ratio of about 1:8, may be prepared from a standard silicon wafer. More generally, solar cells 102 may have aspect ratios of, for example, about 1:2 to about 1:20 and may be prepared from standard size wafers or from wafers of any other suitable dimensions.

Figure 3:
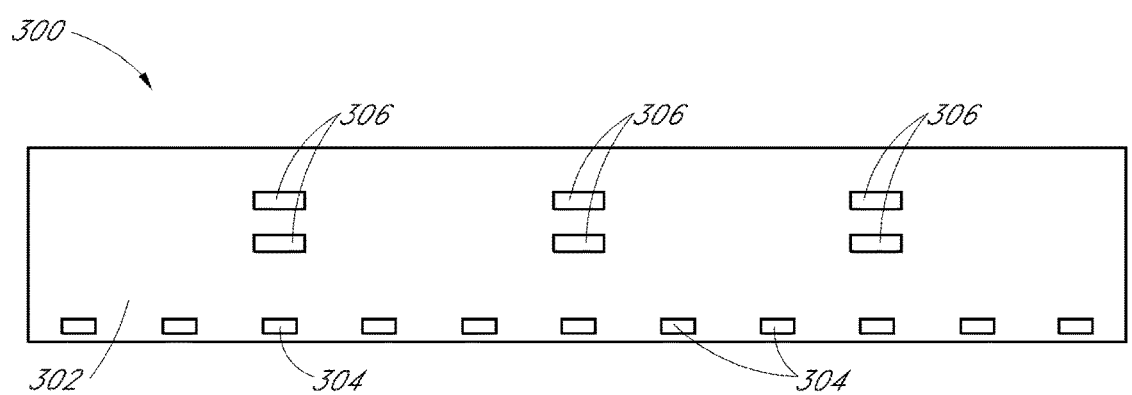
FIG. 3 shows an example solar cell rear surface metallization pattern suitable for use with the defective solar cell bypass techniques discussed herein.

FIG. 3 shows an example solar cell rear surface metallization pattern 300 suitable for use with the defective solar cell bypass techniques discussed herein. The rear surface metallization pattern 300 comprises a continuous aluminum electrical contact 302, a plurality of silver contact pads 304 arranged parallel to and adjacent the edge of a long side of the rear surface of the solar cell, and a plurality of hidden tap contact pads 306 arranged in two rows parallel to the long sides of the solar cell and approximately centered on the rear surface of the solar cell. While FIG. 3 shows three sets of hidden tap contact pads 306, each set having two contact pads 306 (one in each row), it will be understood that any number of sets of hidden tap contact pads 306 may be used (e.g., one, two, three, four, or more) and that each set may include any number of contact pads (e.g., one, two, three, four, or more). As discussed in International Publication WO 2015/183827, which is hereby incorporated by reference herein in its entirety, these hidden tap contact pads 306 may be used for coupling components such as bypass diodes to the rear surface of a solar cell 102. However, it may only be advantageous to couple bypass diodes to a minority of solar cells 102 in a solar module 400 (e.g., one bypass diode for every 21 solar cells 102). On the other hand, it may be advantageous for the rear surface metallization pattern 300 to be the same for each solar cell 102 (e.g., to save costs, to simplify manufacturing processes, etc.). Accordingly, a majority of solar cells 102 may have hidden tap contact pads 306 that are not coupled to bypass diodes and therefore not being used. The inventor discovered another use for these hidden tap contact pads 306: bypassing defective solar cells 502 as discussed herein.

Figure 4:
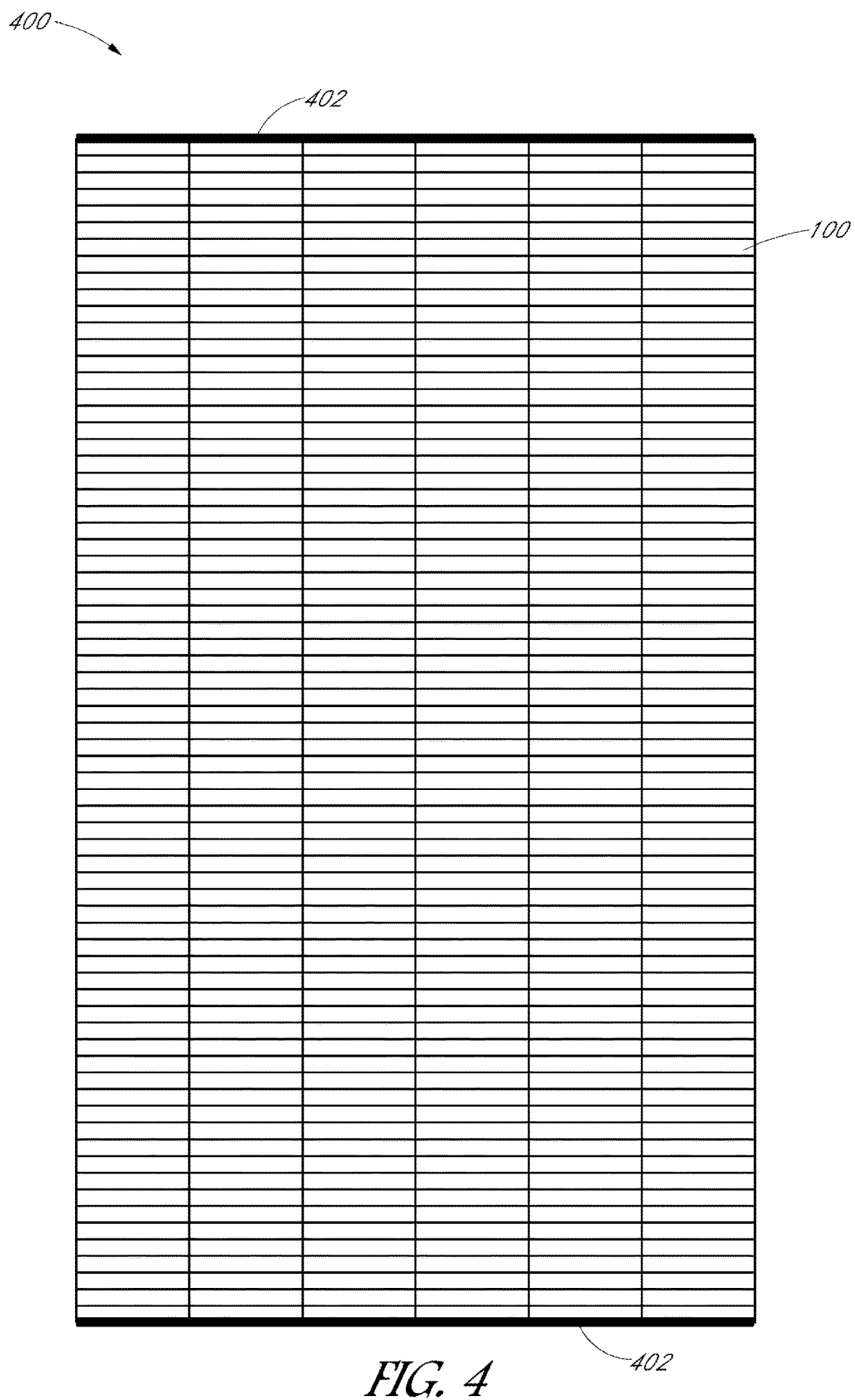
FIG. 4 shows an example rectangular solar module comprising six rectangular super cells, each of which has a length approximately equal to the length of the long sides of the solar module.

FIG. 4 shows an example rectangular solar module 400 comprising six rectangular super cells 100, each of which has a length approximately equal to the length of the long sides of the solar module. The super cells are arranged as six parallel rows with their long sides oriented parallel to the long sides of the module. A similarly configured solar module may include more or fewer rows of such side-length super cells than shown in this example. Each super cell in this example (and in several of the following examples) comprises 72 rectangular solar cells each having a width approximately equal to ⅙ the width of a 156 mm square or pseudo square wafer. Any other suitable number of rectangular solar cells of any other suitable dimensions may also be used. In this example the front surface terminal contacts of the super cells are electrically connected to each other with flexible interconnects 402 positioned adjacent to and running parallel to the edge of one short side of the module. The rear surface terminal contacts of the super cells are similarly connected to each other by flexible interconnects 402 positioned adjacent to and running parallel to the edge of the other short side, behind the solar module. The rear surface interconnects would be hidden or partially hidden from view in the top surface view of FIG. 4, but both the front and rear surface interconnects 402 are shown in FIG. 4 to indicate their location in the module. This arrangement electrically connects the six module-length super cells in parallel.

FIGS. 5A-5I show example illustrations of defective cell bypass conductors 504A-504C, 506A-506C, 508, 510, 512, or 514 used to partially or completely bypass defective solar cells 502 in a super cell 100. As discussed herein, the defective solar cells 502 may be "partially bypassed" or "completely bypassed." It will be understood that a "partially bypassed" defective solar cell 502 does not contribute any power to the electrical output of the solar module 400. A partially bypassed defective solar cell 502 conducts electricity from one neighboring solar cell 102 along the rear surface metallization pattern 300 and then through the defective cell bypass conductor 504A-504C, 506A-506C, 508, 510, 512, or 514 to the next neighboring solar cell 102 in series. The defective cell bypass conductor 504A-504C, 506A-506C, 508, 510, 512, or 514 provides a low resistance path so that current does not have to pass through the defective solar cell 502. By providing this path, the defective solar cell 502 is shorted and will not generate power. Because a partial bypass uses the rear surface metallization pattern 300 to conduct electricity, the rear surface metallization pattern 300 must be intact enough to allow electrical conductivity. Additionally, a partial bypass may not be appropriate if a significant portion of the defective solar cell 502 is missing (also referred to herein as a "chip"). It will be understood that a "completely bypassed" defective solar cell 502 will also not contribute any electrical power to the electrical output of the solar module 400 because the completely bypassed defective solar cell 502 will be short circuited by a defective cell bypass conductor 504A-504C, 506A-506C, 508, 510, 512, or 514 that is coupled to the rear surface metallization pattern 300 of one neighboring solar cell 102 and coupled to the rear surface metallization pattern 300 of the other neighboring solar cell 102. Thus, no current flows along the rear surface metallization pattern 300 of the defective solar cell 502, instead flowing along the low resistance path (i.e., the defective cell bypass conductor 504A-504C, 506A-506C, 508, 510, 512, or 514) between the rear surface metallization patterns 300 of the two neighbor solar cells 102, shorting both the cracked cell and one of the neighbors. Accordingly, in a complete bypass, both the defective solar cell 502 and one of the neighboring solar cells 102 is shorted and do not contribute any electrical power to the output of the solar module 400.

Even though completely bypassing a defective solar cell 502 also necessarily involves bypassing a solar cell 102 that is not defective, it may nonetheless be advantageous to completely bypass defective solar cells 502 because conducting electricity through the rear surface metallization pattern 300 of the defective solar cell 502 may decrease performance (e.g., reliability, durability) of the solar module 400. Additionally, before a defective solar cell 502 may be partially bypassed, it may be advantageous to inspect the rear surface metallization pattern 300 (e.g., by human technician, by machine) to ensure that the rear surface metallization pattern 300 is sufficient for current to flow across it. This inspection may be costly to perform (e.g., costly in time, costly in labor, costly in capital costs of a separate machine), and therefore it may be advantageous to completely bypass a defective solar cell 502 instead.

The defective cell bypass conductors 504A-504C, 506A-506C, 508, 510, 512, or 514 may be made of any of a number of conductive materials such as metal (e.g., copper, silver, aluminum, etc.), conductive composite, or conductive polymers. The defective cell bypass conductors 504A-504C, 506A-506C, 508, 510, 512, or 514 may be coupled to the hidden tap contact pads 306 of the various solar cells 102 and defective solar cells 502 by any of a number of known techniques (e.g., by welding, by electrically conductive adhesive, etc.).

Each of FIGS. 5A-5I includes a view of the rear surface metallization pattern 300 of portions of three super cells 100A, 100B, and 100C. While only six silicon solar cells 102 are shown in each super cell 100 shown on FIGS. 5A-5I, it will be understood that each super cell 100 could include fewer or greater numbers of silicon solar cells 102 (e.g., 72 silicon solar cells 102 as shown in FIG. 4). Each of FIGS. 5A-5I shows at least one defective solar cell 502 and one or more bypass conductors 504A-504C, 506, 508, 510, 512, or 514. As discussed herein, the rear surface metallization pattern 300 of each solar cell 102 includes at least one set of hidden tap contact pads 306 (e.g., a plurality of sets of hidden tap contact pads 306) which may be used to bypass defective solar cells 502. For visual clarity, each such set of hidden tap contact pads is represented by a single contact pad 306 in FIGS. 5A-5I. As noted above, however, a set of hidden tap contact pads may include any number of hidden tap contact pads 306 (e.g., one, two, three, four, or more). While only three sets of hidden tap contact pads 306 are shown in the illustrated examples, a greater number or lesser number of sets may be present. Hence, it will be understood that there may be any number of hidden tap contact pads 306 (e.g., one, two, three, four, or more) included in the rear surface metallization pattern 300 of each solar cell 102 and defective solar cell 502. Additionally, each defective solar cell 502 in FIGS. 5A-5I is shown having a crack on the left side, it will be understood that the defective solar cell 502 may be defective in other ways as discussed herein.

A defective solar cell 502 may include one or more variances from acceptable parameters for a solar cell 102. Such variances may include a crack in the substrate, front surface metallization pattern 200, and/or rear surface metallization pattern 300 of defective solar cell 502; a chip in the defective solar cell 502 (i.e., a piece of the defective solar cell 502 is missing); a malformed front surface metallization pattern 200 of the defective solar cell 502; a malformed rear surface metallization pattern 300 of the defective solar cell 502; an electrical short in the defective solar cell 502; an out-of-specification voltage of the defective solar cell 502; an out-of-specification power output of the defective solar cell 502; poor electrical conductivity from the defective solar cell 502 to another solar cell 102; etc. In short, if the performance (e.g., IV curve, power output, reliability, etc.) of the super cell 100 may be improved by bypassing a particular solar cell 102, that solar cell 102 may be a defective solar cell 502 and it may be advantageous to bypass that particular solar cell 102 as discussed herein.

FIG. 5A shows three super cells 100A, 100B, and 100C, each having at least one defective solar cell 502 and a defective cell bypass conductor 504A, 504B, or 504C. The defective solar bypass conductors 504A, 504B, and 504C may be made of a single, continuous piece of conductive material or made of multiple pieces of conductive material that are conductively bonded to each other (e.g., by welding, by electrically conductive adhesive). Super cell 100A includes a defective solar cell 502 third in series from the top. The defective solar cell 502 in the super cell 100A is completely bypassed by a bypass conductor 504A coupled to a plurality of sets of the hidden tap contact pads 306 of the solar cell 102A and coupled to a plurality of sets of the hidden tap contact pads 306 of the solar cell 102A'. Accordingly, current flowing through the super cell 100A will completely bypass the defective solar cell 502 because current will flow from the solar cell 102A through the bypass conductor 504A to the solar cell 102A'.

Super cell 100B includes a defective solar cell 502 third in series from the top. The defective solar cell 502 in the super cell 100B is partially bypassed by a bypass conductor 504B coupled to a plurality of sets of the hidden tap contact pads 306 of the defective solar cell 502 and coupled to a plurality of sets of the hidden tap contact pads 306 of the solar cell 102B. Electricity is conducted from the solar cell 102B through the bypass conductor 504B to the defective solar cell 502. Current then passes from the rear surface metallization pattern 300 of the defective solar cell 502 to the front surface metallization pattern 200 of the solar cell 102B' as discussed herein.

Super cell 100C includes a first defective solar cell 502 third in series from the top and a second defective solar cell 502 fourth in series from the top. The first and second defective solar cells 502 in the super cell 100C are bypassed by a bypass conductor 504C coupled to a plurality of sets of the hidden tap contact pads 306 of the solar cell 102C and coupled to a plurality of sets of the hidden tap contact pads 306 of the solar cell 102C'. Accordingly, current flowing through the super cell 100C will completely bypass the first and second defective solar cells 502 because current will flow from the solar cell 102C through the bypass conductor 504C to the solar cell 102C'. It will be understood that more than two defective solar cells 502 (e.g., three, four, five, or more) may be bypassed in this way.

FIG. 5B shows three super cells 100A, 100B, and 100C, each having one completely bypassed defective solar cell 502 and one or more defective cell bypass conductors 506A-506C. Super cell 100A includes a defective solar cell 502 third in series from the top. The defective solar cell 502 in the super cell 100A is completely bypassed by a bypass conductor 506A coupled to one set of the hidden tap contact pads 306 of the solar cell 102A and coupled to one set of the hidden tap contact pads 306 of the solar cell 102A'. While FIG. 5B shows the bypass conductor 506A coupled to the set of hidden tap contact pads 306 in the middle of solar cell 102A and coupled to the set of silver hidden contact pads 306 in the middle of solar cell 102A', it will be understood that any of the sets of hidden tap contact pads 306 of solar cell 102A may be so coupled to any of the sets of silver hidden contact pads 306 of solar cell 102A' via the bypass conductor 506A, Accordingly, current flowing through the super cell 100A will completely bypass the defective solar cell 502 because current will flow from the solar cell 102A through the defective cell bypass conductor 506A to the solar cell 102A'. It will be understood that more than one defective solar cells 502 (e.g., two, three, four, five, or more) may be bypassed in this way.

Super cell 100B includes a defective solar cell 502 third in series from the top. The defective solar cell 502 in the super cell 100B is completely bypassed by a pair of defective cell bypass conductors 506B connecting two sets of the hidden tap contact pads 306 of the solar cell 102B to two sets of hidden tap contact pads 306 of the solar cell 102B'. While FIG. 5B shows the sets of hidden tap contact pads 306 on the left and right of solar cell 102B coupled to the sets of silver hidden contact pads 306 on the left and right of solar cell 102B' by the pair of defective cell bypass conductors 506B, it will be understood that any two of the sets of hidden tap contact pads 306 of solar cell 102B of may be so coupled to any two of the sets of silver hidden contact pads 306 of solar cell 102B'. Accordingly, current flowing through the super cell 100B will completely bypass the defective solar cell 502 because current will flow from the solar cell 102B through the defective cell bypass conductors 506B to the solar cell 102B'. It will be understood that more than one defective solar cells 502 (e.g., two, three, four, five, or more) may be bypassed in this way.

Super cell 100C includes a defective solar cell 502 third in series from the top. The defective solar cell 502 in the super cell 100C is completely bypassed by a trio of defective cell bypass conductor 506C coupled to three sets of the hidden tap contact pads 306 of the solar cell 102C and coupled to three sets of hidden tap contact pads 306 of the solar cell 102C'. Accordingly, current flowing through the super cell 100C will completely bypass the defective solar cell 502 because current will flow from the solar cell 102C through the defective cell bypass conductors 506C to the solar cell 102C'. It will be understood that more than one defective solar cell 502 (e.g., two, three, four, five, or more) may be bypassed in this way. Of course, if there are more than three sets of silver hidden contact pads 306 used in the rear surface metallization pattern 300, more than three straight defective cell bypass conductors may be used.

FIG. 5C shows three super cells 100A, 100B, and 100C, each having one partially bypassed defective solar cell 502 and one or more defective cell bypass conductors 506A-506C. Super cell 100A includes a defective solar cell 502 fourth in series from the top. The defective solar cell 502 in the super cell 100A is partially bypassed by a single defective cell bypass conductor 506A coupled to one set of the hidden tap contact pads 306 of the solar cell 102A and coupled to the hidden tap contact pads 306 of the defective solar cell 502. Electricity is conducted from the solar cell 102A through the single defective cell bypass conductor 506A to the defective solar cell 502. Current then passes from the rear surface metallization pattern 300 of the defective solar cell 502 to the front surface metallization pattern 200 of the solar cell 102A' as discussed herein.

While FIG. 5C shows the bypass conductor 506A coupled to the set of hidden tap contact pads 306 in the middle of solar cell 102A and coupled to the set of silver hidden contact pads 306 in the middle of defective solar cell 502, it will be understood that any of the sets of hidden tap contact pads 306 of solar cell 102A may be so coupled to any of the sets of hidden tap contact pads 306 of the defective solar cell 502 if the defective cell bypass conductor 506A allows for a current path to bypass the defects(s). Similarly, a pair of defective cell bypass conductors 506B as in super cell 100B or a trio of defective cell bypass conductors 506C as in super cell 100C may be used. Of course, if there are more than three sets of silver hidden contact pads 306 used in the rear surface metallization pattern 300, more than three straight defective cell bypass conductors may be used.

FIG. 5D shows three super cells 100A, 100B, and 100C, with super cell 100A having a defective solar cell 502 third in series from the top and a single multi-row defective cell bypass conductor 508. The multi-row defective cell bypass conductor 508 may be coupled to the defective solar cell 502 and the solar cells 102 third in series from the top in super cells 100B and 100C via one or more of the sets of silver hidden contact pads 306 of each cell in the row. Accordingly, the multi-row defective cell bypass conductor 508 may create a current path around the defect in the defective solar cell 502, partially bypassing the defective solar cell 502.

FIG. 5E shows three super cells 100A, 100B, and 100C, with super cell 100A having a defective solar cell 502 fourth in series from the top and a pair of multi-row defective cell bypass conductors 508 and 508'. The multi-row defective cell bypass conductor 508 may be coupled to the solar cells 102A, 102B, and 102C via one or more of the sets of silver hidden contact pads 306 of each cell in the row. The multi-row defective cell bypass conductor 508' may be coupled to the defective solar cell 502 and solar cells 102B' and 102C' via one or more of the sets of silver hidden contact pads 306 of each cell in the row. Accordingly, the multi-row defective cell bypass conductors 508 and 508' may create a current path around the defect in the defective solar cell 502, thereby partially bypassing the defective solar cell 502.

FIG. 5F shows three super cells 100A, 100B, and 100C, with super cell 100A having a defective solar cell 502 fourth in series from the top and a pair of multi-row defective cell bypass conductors 508 and 508'. The multi-row defective cell bypass conductor 508 may be coupled to the solar cells 102A, 102B, and 102C via one or more of the sets of silver hidden contact pads 306 of each cell in the row. The multi-row defective cell bypass conductor 508' may be coupled to the solar cells 102A', 102B', and 102C' via one or more of the sets of silver hidden contact pads 306 of each cell in the row. Accordingly, the multi-row defective cell bypass conductors 508 and 508' may create a current path around the defect in the defective solar cell 502, thereby completely bypassing the defective solar cell 502.

Figure 5G:
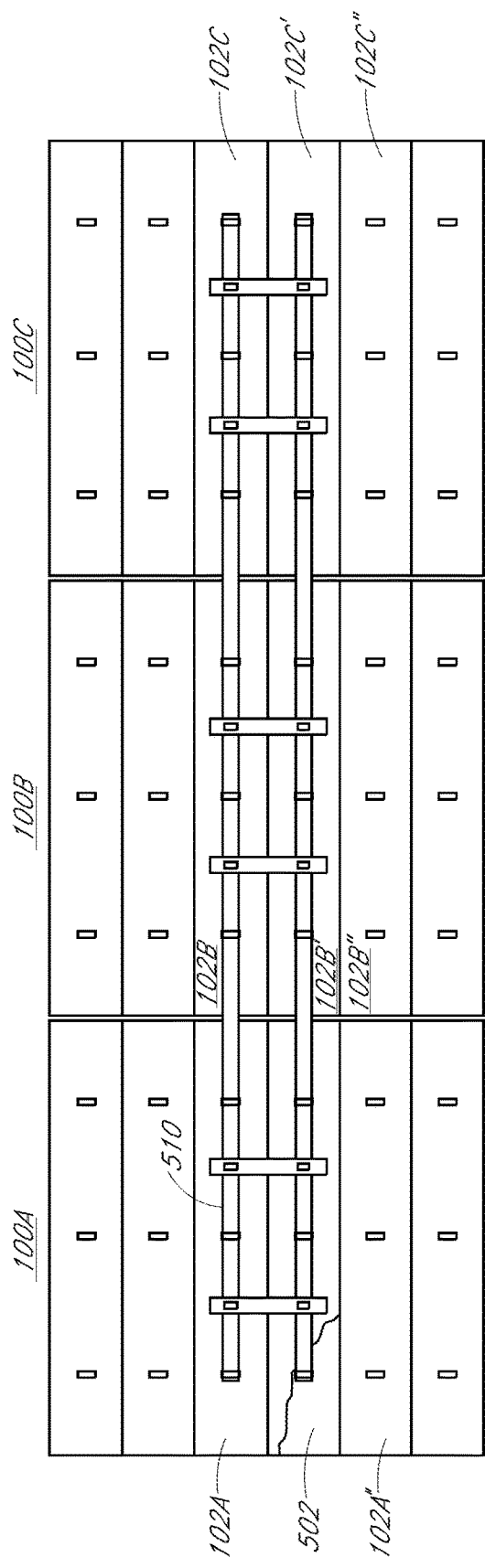

FIG. 5G shows three super cells 100A, 100B, and 100C, with super cell 100A having a defective solar cell 502 fourth in series from the top and a multi-row defective cell bypass conductor 510. The multi-row defective cell bypass conductor 510 may be made of a single, continuous piece of conductive material or made of multiple pieces of conductive material that are conductively bonded to each other (e.g., by welding, by electrically conductive adhesive). The multi-row defective cell bypass conductor 510 may be coupled to the solar cells 102A, 102B, and 102C via one or more of the sets of silver hidden contact pads 306 of each cell in the row. The multi-row defective cell bypass conductor 510 may also be coupled to the defective solar cell 502 and solar cells 102B' and 102C' via one or more of the sets of silver hidden contact pads 306 of each cell in the row. Additionally, it will be understood that the multi-row defective cell bypass conductor 510 could be coupled to the solar cells 102A", 102B", and 102C" instead of to the defective solar cell 502 and solar cells 102B' and 102C' as shown. In such an embodiment, the defective solar cell 502 would be completely rather than partially bypassed. Accordingly, the multi-row defective cell bypass conductor 510 may create a current path around the defect in the defective solar cell 502, either by partially or completely bypassing defective solar cell 502.

Figure 5H:
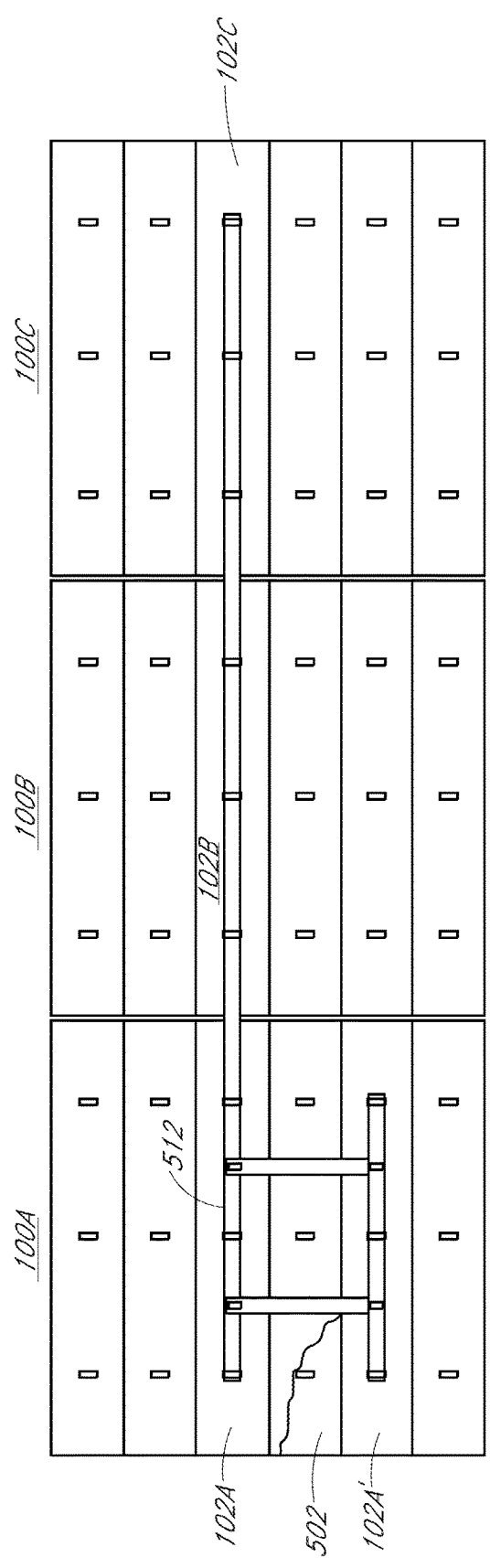

FIG. 5H shows three super cells 100A, 100B, and 100C, with super cell 100A having a defective solar cell 502 fourth in series from the top and a multi-row defective cell bypass conductor 512. The multi-row defective cell bypass conductor 514 may be made of a single, continuous piece of conductive material or made of multiple pieces of conductive material that are conductively bonded to each other (e.g., by welding, by electrically conductive adhesive). The multi-row defective cell bypass conductor 512 may be coupled to solar cells 102A, 102B, 102C, and 102A' as shown in FIG. 5H via one or more of the sets of silver hidden contact pads 306 of each cell. Accordingly, the multi-row defective cell bypass conductor 512 may create a current path around the defect in the defective solar cell 502 by completely bypassing the defective solar cell 502 and the other solar cells 102 fourth in series from the top of super cells 100B and 100C.

Figure 5I:
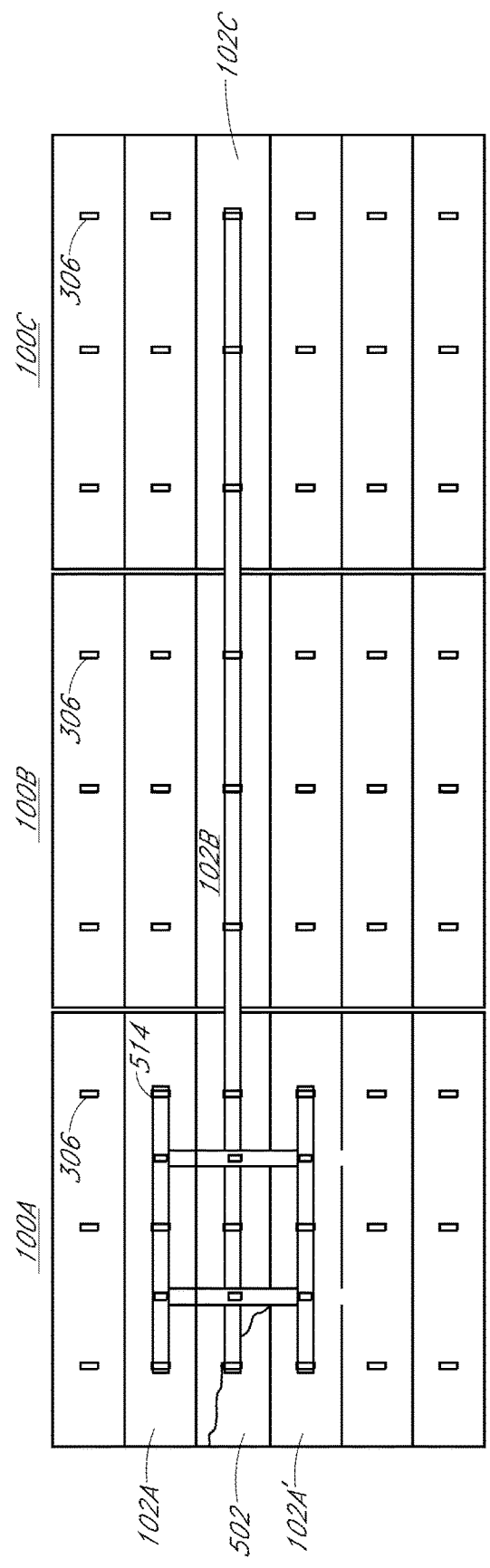

FIG. 5I shows three super cells 100A, 100B, and 100C, with super cell 100A having a defective solar cell 502 fourth in series from the top and a multi-row defective cell bypass conductor 514. The multi-row defective cell bypass conductor 514 may be coupled to solar cells 102A, 102B, 102C, 102A' and defective solar cell 502 via one or more of the sets of silver hidden contact pads 306 of each cell. Accordingly the multi-row defective cell bypass conductor 514 may create a current path around the defect in the defective solar cell 502 by partially bypassing the defective solar cell 502.

FIG. 6 shows examples of solar modules with one or more bypassed solar cells 102 and/or defective solar cells 502. In FIG. 6, bypassed solar cells solar cells 102 and/or defective solar cells 502 are represented by being blacked out. Solar module 600 has one partially bypassed defective solar cell 502 in the second super cell 100 from the left. Solar module 602 has an entire partially bypassed row of solar cells 102 including one or more defective solar cells 502. The solar module 602 could comprise super cells 100 each having an individually partially bypassed defective solar cell 502 (i.e., bypassed with a defective cell bypass 504B) or with a multi-row defective cell bypass 510 that partially bypasses an entire row of defective solar cells 502 and/or solar cells 102. Solar module 604 has a completely bypassed defective solar cell 502 and a bypassed solar cell 102 in the second super cell 100 from the left. Solar module 606 has two bypassed rows of solar cells 102 including one or more defective solar cells 502. The solar module 606 could comprise super cells 100 each having a completely bypassed defective solar cell 502 (i.e., bypassed with a defective cell bypass 504A) or with a multi-row defective cell bypass 510 that completely bypasses two entire rows of defective solar cells 502 and/or solar cells 102. Solar module 608 has one partially bypassed defective solar cell 502 in each super cell 100 in different rows. Solar module 610 includes two partially bypassed defective solar cells 502 in each super cell 100 in different rows. Similarly, a solar module can include super cells 100 that include more than two (e.g., three, four, or more) partially bypassed or completely bypassed defective solar cells 502 in different rows. Such defective solar cells 502 may be partially bypassed or completely bypassed. As discussed below, bypassing a defective solar cell 502 or a solar cell 102 will decrease the power output of a super cell 100 and will also decrease the voltage of the maximum power point (MPP) of that super cell 100.

Figure 7A:
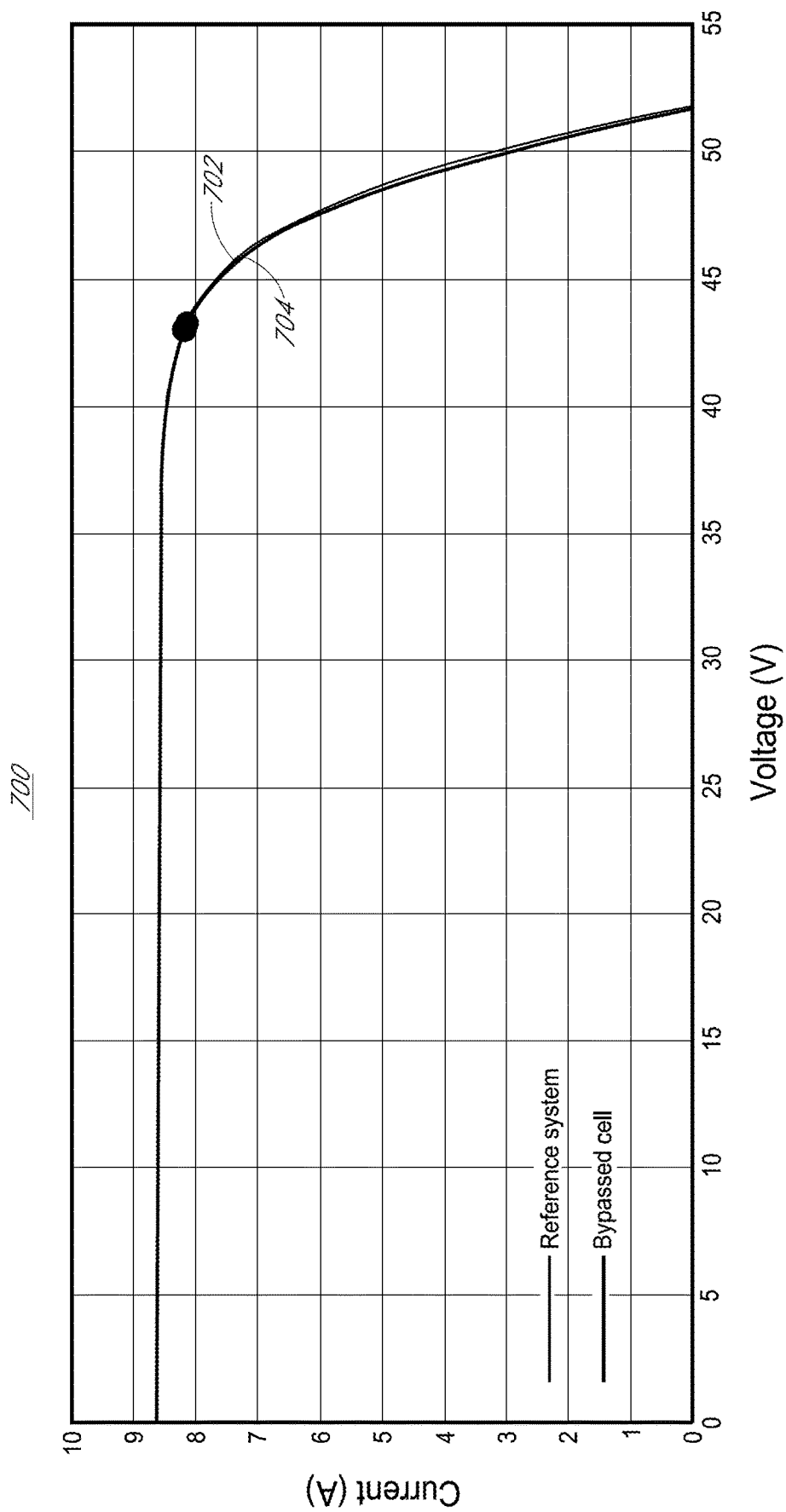
FIGS. 7A, 7B, 7C, and 7D show example IV curves of solar modules with one or more completely bypassed solar cells and/or defective solar cells.
Figure 7B:
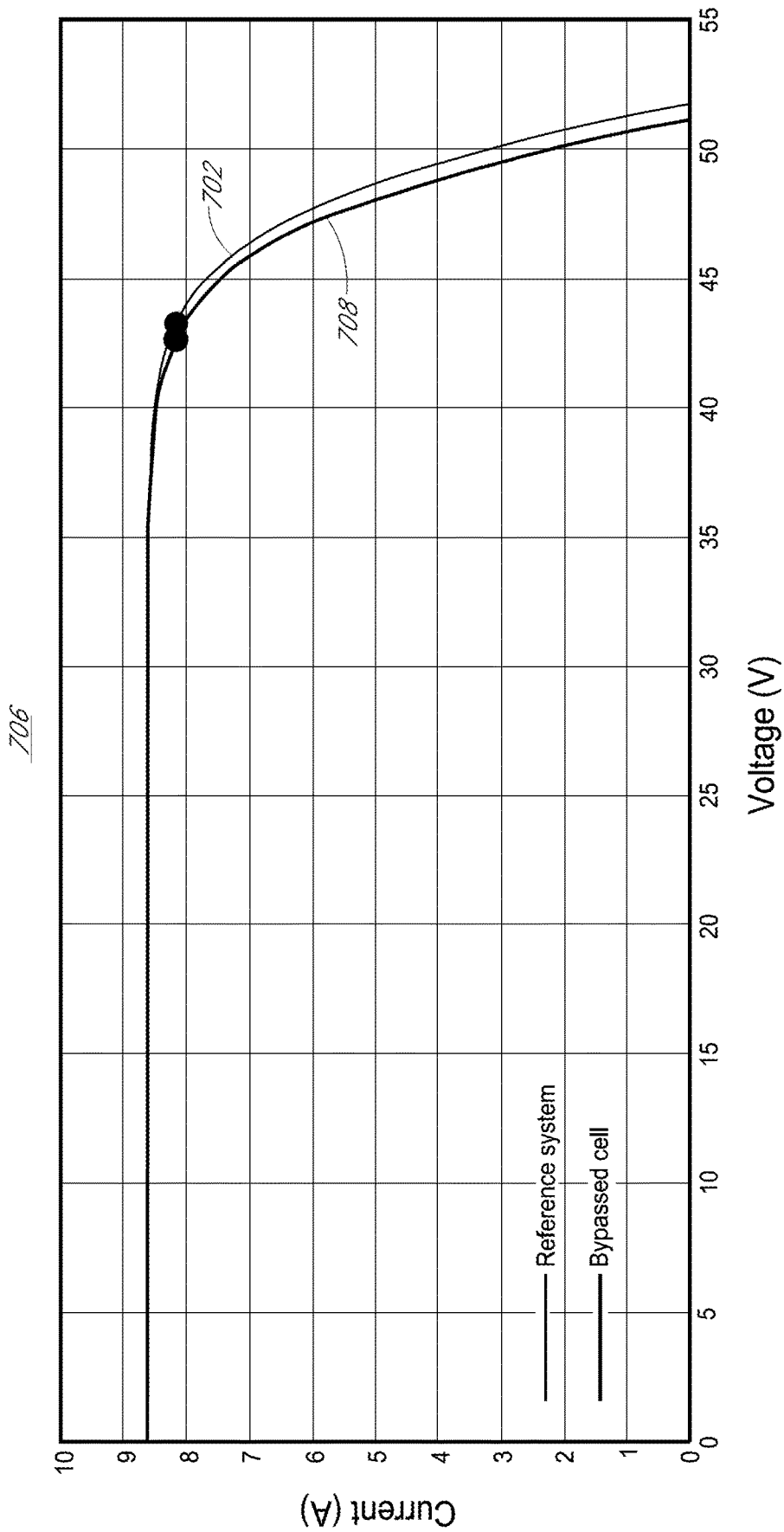
Figure 7C:
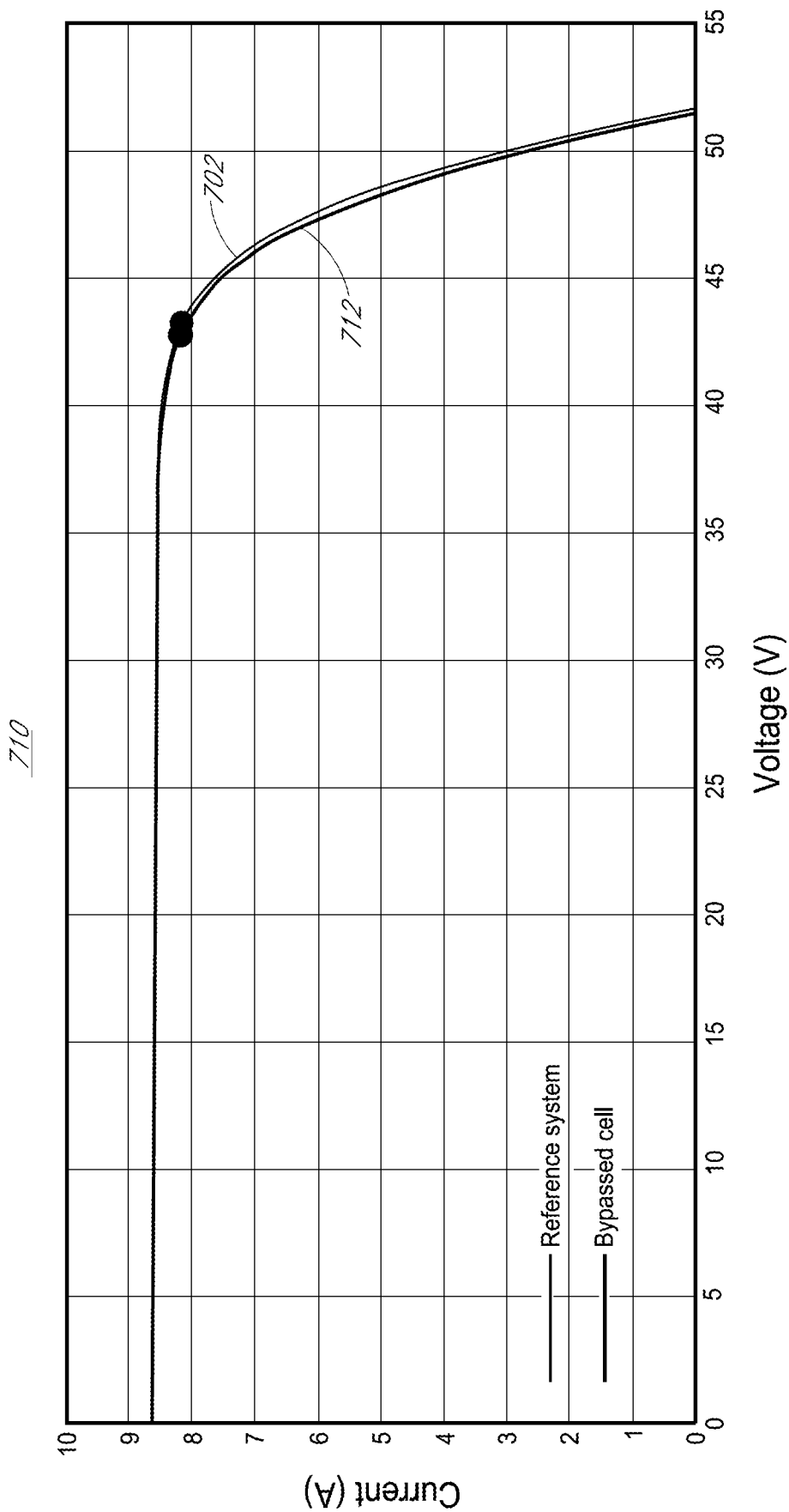

FIGS. 7A-7C show example IV (current-voltage) curves of solar modules with one or more completely bypassed solar cells 102 and/or defective solar cells 502. The X-axis of each curve represents the voltage of the solar module and the Y-axis of each curve represents the current output of the solar module at the voltage on the X-axis. Each IV curve includes a (reference) IV curve of a solar module with no bypassed solar cells 102 and an IV curve of a solar module with one or more defective solar cells 502 and/or bypassed solar cells 102. The dot on each IV curve represents the MPP of the solar module to which the IV curve corresponds. The MPP is the voltage at which the solar module generates the maximum amount of power under current operating conditions. In some embodiments, a controller may be coupled to the solar module and may adjust the operating voltage of the solar module to maintain maximum power ("MPP tracking") generation under changing conditions.

Graph 700 (FIG. 7A) shows an IV curve 702 of a reference solar module with no bypassed solar cells 102 and IV curve 704 of a solar module 600 (FIG. 6) with one bypassed defective solar cell 502. As can be seen from the graph 700, the MPP voltage of the curve 704 is slightly lower than the MPP voltage of the curve 702. Because the current through the solar module at the MPP voltage for both the reference solar module and the solar module 600 is the same (e.g., to prevent damaging a super cell 100 with too much current flow), the total power generated by the solar module 600 at MPP voltage will be lower than the reference solar module. It will also be understood that because the super cells 100 of the solar module 600 are in parallel, the voltage across each super cell 100 (including the super cell 100 with the completely bypassed defective solar cell 502) will be identical. Accordingly, the MPP voltage for the super cell 100 with the bypassed defective solar cell 502 will also be the voltage across the other super cells 100, resulting in a reduction of power generation potential by the other super cells 100.

Graph 706 (FIG. 7B) shows the IV curve 702 of a reference solar module with no bypassed solar cells 102 and an IV curve 708 of a solar module 602 or 608 (FIG. 6) with one bypassed solar cell (either solar cells 102 or defective solar cells 502) in each super cell 100. As can be seen from the graph 706, the MPP voltage of the curve 708 is lower than the MPP voltage of the curve 702 by a larger amount than the curve 704 from graph 700. Because the current through the solar module at the MPP voltage for both the reference solar module and the solar module 602 or 608 is the same, the total power generated by the solar module 602 or 608 at the MPP voltage will be lower than the reference solar module. However, because there is a bypassed solar cell in each super cell 100 of the solar modules 602 and 608, the MPP voltage for each super cell 100 in the solar modules 602 and 608 is identical. Accordingly, there is no reduction of power generation potential of super cells not including a bypassed solar cell, as occurs in the solar module 600.

Graph 710 (FIG. 7C) shows the IV curve 702 of a reference solar module with no bypassed solar cells 102 and an IV curve 712 of a solar module 604 (FIG. 6) with two bypassed defective solar cell 502 in a single super cell 100. As can be seen from the graph 710, the MPP voltage of the curve 712 is lower than the MPP voltage of the curve 702. Because the current through the solar module at the MPP voltage for both the reference solar module and the solar module 604 is the same, the total power generated by the solar module 604 at the MPP voltage will be lower than the reference solar module. It will also be understood that because the super cells 100 of the solar module 604 are in parallel, the voltage across each super cell 100 (including the super cell 100 with the two completely bypassed defective solar cells 502) will be identical. Accordingly, the MPP voltage for the super cell 100 with the two bypassed defective solar cells 502 will also be the voltage across the other super cells 100, resulting in a reduction of power generation potential by the other super cells 100.

Figure 7D:
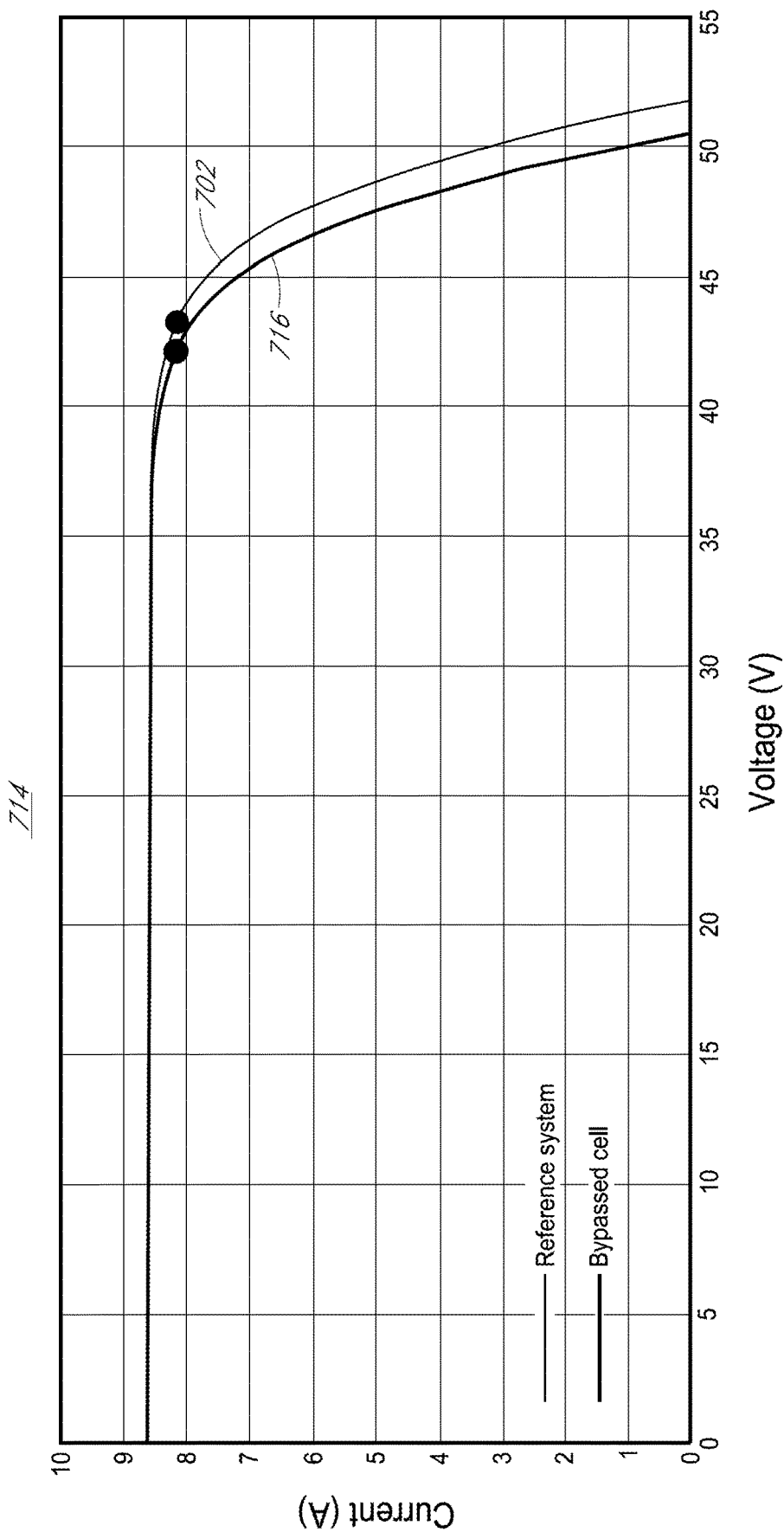

Graph 714 (FIG. 7D) shows the IV curve 702 of a reference solar module with no bypassed solar cells 102 and IV curve 708 of a solar module 606 or 610 (FIG. 6) with two bypassed solar cell (either solar cells 102 or defective solar cells 502) in each super cell 100. As can be seen from the graph 714, the MPP voltage of the curve 708 is lower than the MPP voltage of the curve 702 by a larger amount than the curve 704 from graphs 700, 706, and 710. Because the current through the panel at the MPP voltage for the both the reference solar module and the solar module 606 or 610 is the same, the total power generated by the solar module 606 or 610 at the MPP voltage will be lower than the reference solar module. However, because there is a bypassed solar cell in each super cell 100 of the solar modules 606 and 610, the MPP voltage for each super cell 100 in the solar modules 606 and 610 is identical. Accordingly, there is no reduction of power generation potential of super cells not including a bypassed solar cell, as occurs in the solar module 600 or 604.

Figure 8A:
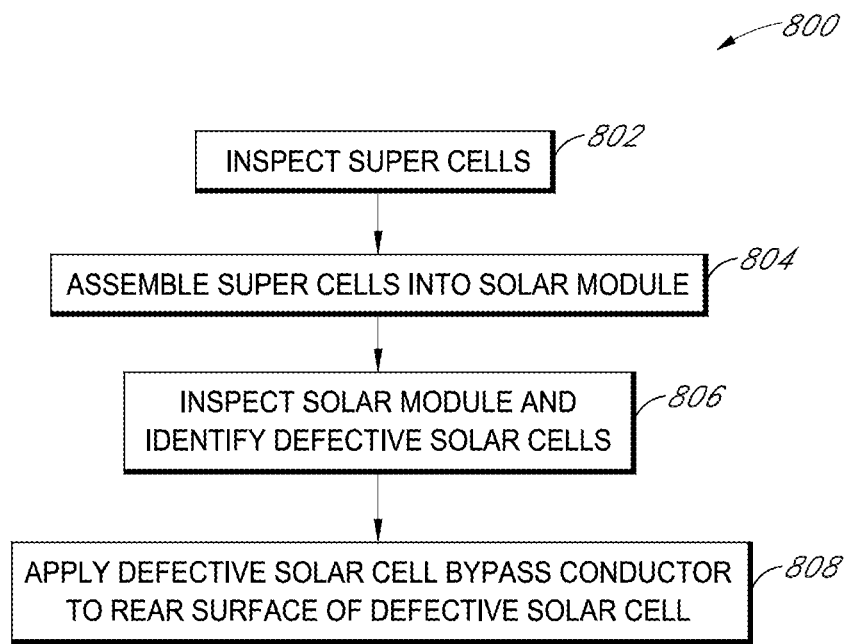
FIGS. 8A-8B depict example inspection and reworking methods for reworking a super cell in accordance with the presently described embodiments.

Referring now to FIG. 8A, a block diagram shows an inspection and reworking method 800 for reworking a super cell 100 with one or more defective solar cells. Before the method 800 commences, a number of super cells 100 are assembled. Once a number of super cells 100 (e.g., six super cells 100) are assembled, the super cells 100 may be inspected to determine whether there are one or more defective solar cells 502 in the super cell 100 at block 802. The inspection may include one or more of visual inspection, electroluminescence testing, or photoluminescence testing. A visual inspection may be performed by a human technician examining the super cell 100 to identify one or more defective solar cells 502. Additionally or alternatively, visual inspection may be performed by a computer coupled to a camera. Electroluminescence testing may include applying a charge to a super cell 100 and measuring (e.g., with a computer coupled to a camera, with a human technician) the light pattern emitted by the super cell 100 to identify one or more defects. Photoluminescence testing may include applying a homogenous wavelength of light (e.g., 800 nm red light) to the super cell 100 and measuring (e.g., with a computer coupled to a camera, with a human technician) the light pattern emitted by the super cell 100 to identify one or more defects.

If no defects are detected, the super cells 100 may be assembled into a solar module 400 at block 804. Alternatively, if one or more defective solar cells 502 are detected in the super cell 100, the super cell 100 may be set aside to be assembled into a solar module 400 comprising super cells 100 with defective solar cells 502 on the same rows (e.g., each super cell 100 has a defective solar cell 502 fifth in series from the top and a defective solar cell 502 twentieth in series from the top).

The solar module 400 may then be inspected to determine whether there are defective solar cells 502 in the solar modules. As discussed herein, the inspection may be one or more of visual inspection or electroluminescence testing. If one or more defective solar cells 502 are detected, at block 808 one or more bypass conductors (e.g., 504A-504C, 506A-506C, 508, 510, 512, or 514) may be applied to the rear surface of super cell(s) 100 to bypass (partially or completely) the defective solar cells 502 in accordance with the present disclosure.

Figure 8B:
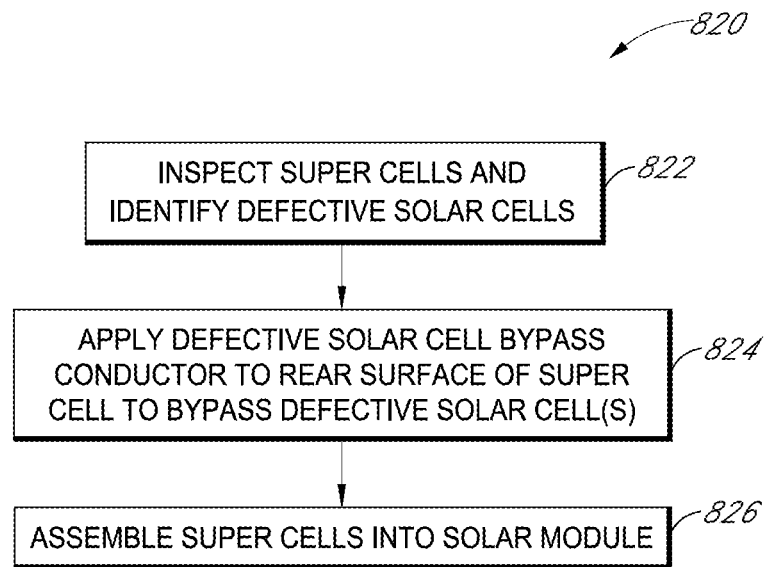

Referring now to FIG. 8B, a block diagram shows an inspection and reworking method 820 for reworking a super cell 100 with one or more defective solar cells 502. In contrast to the method 800, the method 820 may include reworking super cells 100 by installing one or more bypass conductors (e.g., 504A-504C, 506A-506C, 508, 510, 512, or 514) before assembling the super cells 100 into a solar module 400. Accordingly, at block 822 the super cells 100 are inspected (e.g., visual inspection, electroluminescence testing) and defective solar cells 502 are identified. At block 824, one or more bypass conductors may be applied to the rear surface of super cell(s) 100 to bypass (partially or completely) the defective solar cells 502 in accordance with the present disclosure. At block 826, the super cells 100 may be assembled into a solar module 400. As discussed herein, a solar module 400 may include super cells 100 with bypassed defective solar cells 502 and super cells 100 with no bypassed solar cells (e.g., the solar modules 600 or 604). Alternatively, a solar module 400 may include only super cells with bypassed defective solar cells 502 (e.g., solar modules 608 or 610).

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus comprising:
 a first super cell and a second super cell physically arranged in parallel rows;
 each super cell comprising a plurality of solar cells arranged with sides of adjacent solar cells overlapping in a shingled manner and conductively bonded to each other in series;

the first super cell comprising a defective solar cell that is bonded to two adjacent solar cells in the first super cell; and a bypass conductor electrically connecting a contact pad on the defective solar cell in the first super cell to a contact pad of a solar cell in the second super cell providing an electrically conductive path between these two solar cells, the electrically conductive path not comprising a bypass diode.

2. The apparatus of claim 1 comprising a third super cell physically arranged in parallel to the first and second super cells, the third super cell comprising a plurality of solar cells arranged with sides of adjacent solar cells overlapping in a shingled manner and conductively bonded to each other in series;

wherein the bypass conductor connects to a contact pad on a solar cell in the third super cell providing an electrically conductive path between the defective solar cell, the solar cell in the second super cell, and the solar cell in the third super cell, the electrically conductive path not comprising a bypass diode.

3. The apparatus of claim 2 wherein the defective solar cell in the first super cell, the solar cell in the second super cell, and the solar cell in the third super cell are arranged in a line.

4. The apparatus of claim 1 comprising:

a second bypass conductor electrically connecting a contact pad on one of the solar cell adjacent to the defective solar cell in the first super cell to a contact pad on a solar cell in the second super cell providing a second electrically conductive path between these two solar cells, the second electrically conductive path not comprising a bypass diode.

5. The apparatus of claim 4 wherein the solar cells connected by the second bypass conductor are arranged in a line.

6. An apparatus comprising:

a first super cell and a second super cell physically arranged in parallel rows;

each super cell comprising a plurality of solar cells arranged with sides of adjacent solar cells overlapping in a shingled manner and conductively bonded to each other in series;

the first super cell comprising a defective solar cell that is bonded to a first and a second adjacent solar cells in the first super cell;

a first bypass conductor electrically connecting a contact pad on the first adjacent solar cell to a contact pad on a first solar cell in the second super cell providing a first electrically conductive path between these two solar cells, the first electrically conductive path not comprising a bypass diode; and a second bypass conductor electrically connecting a contact pad on the second adjacent solar cell to a contact pad on a second solar cell in the second super cell providing a second electrically conductive path between these two solar cells, the second electrically conductive path not comprising a bypass diode.

7. The apparatus of claim 6 wherein the solar cells connected by the first bypass conductor are arranged in a line.

8. The apparatus of claim 7 wherein the solar cells connected by the second bypass conductor are arranged in a line.

9. The apparatus of claim 6 comprising a third super cell physically arranged in parallel to the first and second super cells, the third super cell comprising a plurality of solar cells arranged with sides of adjacent solar cells overlapping in a shingled manner and conductively bonded to each other in series;

wherein the first bypass conductor connects to a contact pad on a solar cell in the third super cell providing an electrically conductive path between the first adjacent solar cell, the solar cell in the second super cell, and the solar cell in the third super cell, the electrically conductive path not comprising a bypass diode.

10. The apparatus of claim 6 comprising a conductor connecting the first bypass conductor to the second bypass conductor providing an electrically conductive path between the first and second adjacent solar cells in the first super cell, the first solar cell in the second super cell, and the second solar cell in the second super cell, the electrically conductive path not comprising a bypass diode.

11. The apparatus of claim 1 wherein the bypass conductor electrically connects a contact pad on the first adjacent solar cell in the first super cell providing an electrically conductive path between the defective solar cell in the first super cell, the first adjacent solar cell in the first super cell, and the solar cell in the second super cell, the electrically conductive path not comprising a bypass diode.

12. The apparatus of claim 11 comprising a third super cell physically arranged in parallel to the first and second super cells, the third super cell comprising a plurality of solar cells arranged with sides of adjacent solar cells overlapping in a shingled manner and conductively bonded to each other in series;

wherein the bypass conductor connects to a contact pad on a solar cell in the third super cell providing an electrically conductive path between the defective solar cell in the first super cell, the first adjacent solar cell in the first super cell, the solar cell in the second super cell, and the solar cell in the third super cell, the electrically conductive path not comprising a bypass diode.

13. The apparatus of claim 12 wherein the first adjacent solar cell in the first super cell, the solar cell in the second super cell, and the solar cell in the third super cell are arranged in a line.

14. The apparatus of claim 12 wherein the defective solar cell in the first super cell, the solar cell in the second super cell, and the solar cell in the third super cell are arranged in a line.

15. The apparatus of claim 11 wherein the bypass conductor connects to a contact pad on the second adjacent solar cell in the first super cell providing an electrically conductive path between the defective solar cell in the first super cell, the first and second adjacent solar cells in the first super cell, and the solar cell in the second super cell, the electrically conductive path not comprising a bypass diode.

16. The apparatus of claim 15 comprising a third super cell physically arranged in parallel to the first and second super cells, the third super cell comprising a plurality of solar cells arranged with sides of adjacent solar cells overlapping in a shingled manner and conductively bonded to each other in series;

wherein the bypass conductor connects to a contact pad on a solar cell in the third super cell providing an electrically conductive path between the defective solar cell in the first super cell, the first and second adjacent solar cells in the first super cell, the solar cell in the second super cell, and the solar cell in the third super cell, the electrically conductive path not comprising a bypass diode.

17. The apparatus of claim 16 wherein the defective solar cell in the first super cell, the solar cell in the second super cell, and the solar cell in the third super cell are arranged in a line.

18. An apparatus comprising:
   a first and a second super cells physically arranged in parallel rows;
   each super cell comprising a plurality of solar cells arranged with sides of adjacent solar cells overlapping in a shingled manner and conductively bonded to each other in series;
   the first super cell comprising a defective solar cell that is bonded to a first and a second adjacent solar cells;
   a bypass conductor electrically connecting a contact pad on the first adjacent solar cell, a contact pad on the second adjacent solar cell, and a contact pad on a solar cell in the second super cell providing an electrically conductive path between these solar cells, the electrically conductive path not comprising a bypass diode.

19. The apparatus of claim 18 comprising
   a third super cell physically arranged in parallel to the first and second super cells, the third super cell comprising a plurality of solar cells arranged with sides of adjacent solar cells overlapping in a shingled manner and conductively bonded to each other in series;
   wherein the bypass conductor connects to a contact pad on a solar cell in the third super cell providing an electrically conductive path between the first and second adjacent solar cells in the first super cell, the solar cell in the second super cell, and the solar cell in the third super cell, the electrically conductive path not comprising a bypass diode.

20. The apparatus of claim 19 wherein the first adjacent solar cell in the first super cell, the solar cell in the second super cell, and the solar cell in the third super cell are arranged in a line.

* * * * *